(12) United States Patent
Kobayashi et al.

(10) Patent No.: US 10,100,397 B2
(45) Date of Patent: Oct. 16, 2018

(54) VAPOR DEPOSITION UNIT, VAPOR DEPOSITION DEVICE, AND VAPOR DEPOSITION METHOD

(71) Applicant: SHARP KABUSHIKI KAISHA, Sakai, Osaka (JP)

(72) Inventors: Yuhki Kobayashi, Sakai (JP); Shinichi Kawato, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/552,796

(22) PCT Filed: Feb. 18, 2016

(86) PCT No.: PCT/JP2016/054746
§ 371 (c)(1),
(2) Date: Aug. 22, 2017

(87) PCT Pub. No.: WO2016/136595
PCT Pub. Date: Sep. 1, 2016

(65) Prior Publication Data
US 2018/0047904 A1 Feb. 15, 2018

(30) Foreign Application Priority Data
Feb. 25, 2015 (JP) ................. 2015-035329

(51) Int. Cl.
| | |
|---|---|
| C23C 16/00 | (2006.01) |
| C23C 4/134 | (2016.01) |
| C23C 14/24 | (2006.01) |
| H01L 51/50 | (2006.01) |
| H01L 21/203 | (2006.01) |
| C23C 14/04 | (2006.01) |

(52) U.S. Cl.
CPC ............ *C23C 4/134* (2016.01); *C23C 14/042* (2013.01); *C23C 14/044* (2013.01); *C23C 14/24* (2013.01); *H01L 21/203* (2013.01); *H01L 51/50* (2013.01); *H01L 2221/1052* (2013.01); *H01L 2221/1068* (2013.01)

(58) Field of Classification Search
CPC ...................................................... C23C 14/24
USPC .................................................. 118/726, 727
See application file for complete search history.

(56) References Cited

U.S. PATENT DOCUMENTS

| | | | |
|---|---|---|---|
| 2008/0216749 A1* | 9/2008 | Aulbach ............... | C23C 14/243 118/726 |
| 2010/0297349 A1 | 11/2010 | Lee et al. | |

(Continued)

FOREIGN PATENT DOCUMENTS

| | | |
|---|---|---|
| JP | 2010-270396 A | 12/2010 |
| JP | 2014-162969 A | 9/2014 |

*Primary Examiner* — Keath T Chen
(74) *Attorney, Agent, or Firm* — ScienBiziP, P.C.

(57) ABSTRACT

A vapor deposition unit (1) includes: a vapor deposition mask (10); a limiting plate unit (20) having limiting plates (22); and a vapor deposition source (30). The vapor deposition source (30) includes: a plurality of first openings (31) for injection of vapor deposition particles; and at least one second opening (32) for pressure release, wherein each of the first openings (31) is provided in a corresponding one of limiting plate openings (23) between the limiting plates (22) in a plan view, and the at least one second opening (32) is provided in such a position as not to face the limiting plate openings (23) in a plan view.

10 Claims, 8 Drawing Sheets

(56) References Cited

U.S. PATENT DOCUMENTS

2013/0059063 A1* 3/2013 Kawato ................ C23C 14/042
            427/66
2013/0089941 A1* 4/2013 Sonoda ................ C23C 14/042
            438/46

* cited by examiner

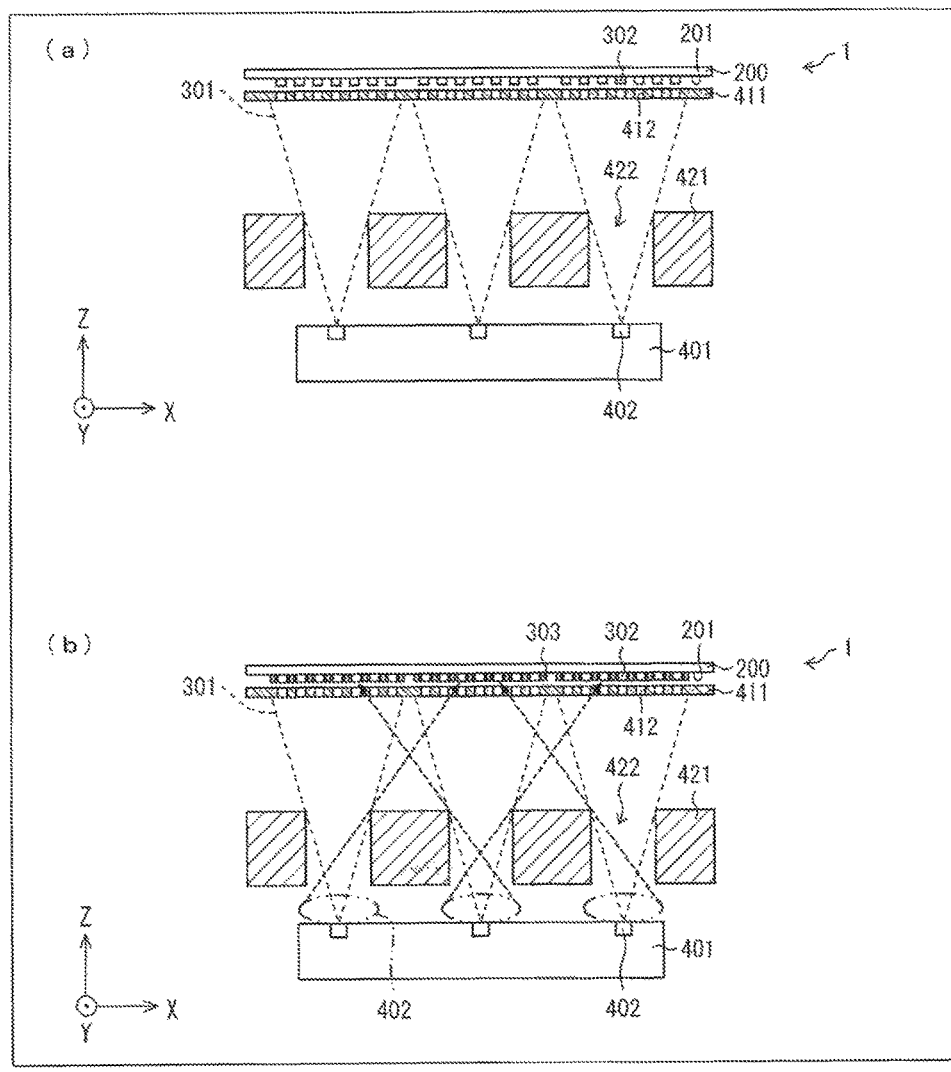

VAPOR DEPOSITION UNIT, VAPOR DEPOSITION DEVICE, AND VAPOR DEPOSITION METHOD

TECHNICAL FIELD

The present invention relates to a vapor deposition unit, a vapor deposition device, and a vapor deposition method each for forming, on a film formation target substrate, a vapor-deposited film having a predetermined pattern.

BACKGROUND ART

Recent years have witnessed practical use of a flat-panel display in various products and fields. This has led to a demand for a flat-panel display that is larger in size, that achieves higher image quality, and that consumes less power.

Under such circumstances, great attention has been drawn to an organic electroluminescent (hereinafter abbreviated to "EL") display device that (i) includes an organic EL element which uses electroluminescence of an organic material and that (ii) is an all-solid-state flat-panel display which is excellent in, for example, low-voltage driving, high-speed response, and self-emitting.

An active matrix organic EL display device includes, for example, (i) a substrate made up of members such as a glass substrate and TFTs (thin film transistors) provided on the glass substrate and (ii) thin film organic EL elements provided on the substrate and electrically connected to the TFTs.

A full-color organic EL display device typically includes organic EL elements of red (R), green (G), and blue (B) as sub-pixels aligned on a substrate. A full-color organic EL display device carries out an image display by, with use of TFTs, selectively causing the organic EL elements to each emit light with a desired luminance.

Thus, such an organic EL display device needs to be produced through at least a process that forms, for each organic EL element, a luminescent layer having a predetermined pattern and made of an organic luminescent material which emits light of one of the above three colors.

The luminescent layer having a pattern can be formed by, for example, a vacuum vapor deposition method. In the vacuum vapor deposition method, vapor deposition particles are vapor-deposited onto a film formation target substrate through a vapor deposition mask (also referred to as a shadow mask) having openings in a predetermined pattern. In this case, the vapor deposition is carried out for each color of the luminescent layers (This is referred to as "selective vapor deposition").

In so doing, a process for mass production is carried out by commonly using a method of carrying out vapor deposition while a film formation target substrate and a vapor deposition mask equivalent in size to the film formation target substrate are brought into close contact with each other. This method, however, requires the vapor deposition mask to be larger in size as the film formation target substrate is larger in size.

Such an increase in size of the vapor deposition mask easily causes a gap between the film formation target substrate and the vapor deposition mask due to self-weight bending and extension of the vapor deposition mask. Therefore, with a large-sized film formation target substrate in use, it is difficult to carry out patterning with high accuracy, and there will occur positional displacement of vapor deposition and/or color mixture. This makes it difficult to form a high-definition vapor-deposition pattern.

Further, as the film formation target substrate is larger in size, the vapor deposition mask, a frame that holds the vapor deposition mask, and others are enormously larger in size and weight. Thus, the increase in size of the film formation target substrate makes it difficult to handle, for example, the vapor deposition mask and the frame. This may cause a problem with productivity and/or safety. Further, a vapor deposition device itself and its accompanying devices are also larger in size and complicated. This makes device design difficult and increases installation cost.

In contrast, there is a scanning vapor-deposition method of, while scanning a film formation target substrate and a vapor deposition mask in a state in which they are spaced away from each other, carrying out vapor deposition on an entire surface of the film formation target substrate. The vapor deposition mask used in this method is smaller in size than the film formation target substrate. Thus, the scanning vapor-deposition method eliminates the problem characteristic of the use of a large-sized vapor deposition mask.

The scanning vapor-deposition method involves a vapor deposition source having a plurality of injection holes so arranged at a predetermined pitch in a direction perpendicular to the scanning direction as to allow vapor deposition particles to be injected.

In recent years, there have thus been proposed methods of limiting flows of vapor deposition particles (vapor deposition flows) with use of limiting plates so that vapor deposition particles injected from a first injection hole corresponding to a first region on a film formation target surface of a film formation target substrate will not fly toward a second region (hereinafter referred to as "adjacent film formation target region") adjacent to the first region and corresponding to a second injection hole (adjacent nozzle).

Patent Literature 1 discloses, for example, that a blocking wall assembly is provided on one side of a vapor deposition source, the blocking wall assembly including, as limiting plates, a plurality of blocking walls partitioning a space between the vapor deposition source and a vapor deposition mask into a plurality of vapor deposition spaces. According to Patent Literature 1, since the blocking walls limit a vapor deposition range, it is possible to vapor-deposit a pattern with high definition while preventing spread of a vapor deposition pattern.

CITATION LIST

Patent Literatures

[Patent Literature 1] Japanese Patent Application Publication, Tokukai, No. 2010-270396 (Publication Date: Dec. 2, 2010)

[Patent Literature 2] Japanese Patent Application Publication, Tokukai, No. 2014-162969 (Publication Date: Sep. 8, 2014)

SUMMARY OF INVENTION

Technical Problem

Unfortunately, in a case where the vapor deposition density is high (that is, the vapor deposition rate is high), the use of the limiting plates alone fails to prevent vapor deposition particles injected from the adjacent nozzle from flying.

(a) and (b) of FIG. 10 are each a view schematically illustrating how vapor deposition flows vary depending on the difference in the vapor deposition density in a case where a plurality of limiting plates 421 arranged along a direction perpendicular to the scanning direction are provided, in a plan view, between a vapor deposition source 401 and a vapor deposition mask 411.

(a) of FIG. 10 illustrates a case where the vapor deposition density is relatively low (low vapor deposition rate). (b) of FIG. 10 illustrates a case where the vapor deposition density is relatively high (high vapor deposition rate).

(a) and (b) of FIG. 10 each show (i) a Y axis as a horizontal axis extending in a scanning direction of the film formation target substrate 200, (ii) an X axis as a horizontal axis extending in a direction perpendicular to the scanning direction of the film formation target substrate 200, and (iii) a Z axis as a vertical axis (up-and-down axis) which is perpendicular to each of the X axis and the Y axis, which is normal to a film formation target surface 201 (film formation target surface) of the film formation target substrate 200, and in which a vapor deposition axis orthogonal to the film formation target surface 201 extends.

As illustrated in (a) of FIG. 10, at the low vapor deposition rate, vapor deposition particles 301 injected from injection holes 402 (nozzles) of the vapor deposition source 401 are controlled so as to have distribution high in directivity by causing vapor deposition components having poor directivity to be blocked (captured) by limiting plate openings 422 which are provided between the individual limiting plates 421. As a result, a vapor-deposited film 302 having a predetermined pattern is formed in a region corresponding to each of the injection holes 402.

On the other hand, as illustrated in (b) of FIG. 10, at the high vapor deposition rate, vapor deposition particles 301 from an adjacent injection hole 402 fly into a normally patterned vapor-deposited film 302 (normally patterned film), and an abnormally patterned vapor-deposited film 303 (abnormally patterned film) is formed between normally patterned vapor-deposited films 302.

This occurs for the following reason: At the high vapor deposition rate, the vapor deposition particles 301 in the vapor deposition source 401 increase although the injection holes 402 for film formation is the only openings provided in the vapor deposition source 401. This causes a locally increased vapor deposition density in the injection holes 402 and thus causes an increase in pressure. As a result, the vapor deposition particles 301 having a smaller mean free path easily scatter from the injection holes 402 having an opening of small area. This apparently (pseudoly) widens the injection hole 402, as indicated by a two-dot chain line in (b) of FIG. 10. The vapor deposition particles 301 flown from a pseudoly widen area of the injection hole 402 pass through the limiting plate openings 422 and then pass the mask opening 412 corresponding to the adjacent nozzle. This causes the vapor deposition particles 301 from the adjacent injection hole 402 to be flown into the normally patterned film and causes formation of an abnormally patterned vapor-deposited film 303. These phenomena cause a light emission abnormality such as a color mixed light emission, which may greatly decrease the display quality.

Patent Literature 2 discloses a vapor deposition device in which (i) a vapor deposition rate of a vapor deposition material is determined based on a difference between measured values measured by first and second pressure sensors, the first pressure sensor detecting pressure in a vapor deposition source (crucible) and the second pressure sensor detecting pressure in a vacuum chamber, and (ii) the degree of opening of a flow rate control valve is controlled so that the determined vapor deposition rate is set to a predetermined vapor deposition rate, thereby adjusting a flow rate of the vapor deposition material supplied to a guiding path for transporting the vapor deposition material from the vapor deposition source.

The vapor deposition device disclosed in Patent Literature 2, however, can monitor only the pressure in the crucible and the pressure in the vacuum chamber, and thus cannot respond to a variation in pressure of the vapor deposition material in injection holes. The vapor deposition device disclosed in Patent Literature 2 also has a complicated pressure control system, which may lead to increases in cost.

According to an aspect of the present invention, it is possible to provide a vapor deposition unit, a vapor deposition device, and a vapor deposition method each of which allows the at least one second opening to relieve pressure at the film formation, with the result that it is possible to, by a simple technique, prevent an increase in pressure at and near the injection holes and prevent the occurrence of abnormal film formation.

Solution to Problem

In order to solve the above problems, a vapor deposition unit in accordance with an aspect of the present invention is a vapor deposition unit for forming, on a film formation target substrate, a vapor-deposited film having a predetermined pattern, the vapor deposition unit including: a vapor deposition source; a vapor deposition mask placed between the vapor deposition source and the film formation target substrate; and a limiting plate unit arranged between the vapor deposition source and the vapor deposition mask, the limiting plate unit including a plurality of first limiting plates which are spaced away from each other as viewed in a direction perpendicular to a principal surface of the vapor deposition mask, the vapor deposition source including: a plurality of first openings for injection of vapor deposition particles; and at least one second opening for pressure release, wherein each of the first openings is provided in a corresponding one of gaps between the first limiting plates as viewed in the direction perpendicular to the principal surface of the vapor deposition mask, and the at least one second opening is provided in such a position as not to face the gaps between the first limiting plates as viewed in the direction perpendicular to the principal surface of the vapor deposition mask.

Further, in order to solve the above problems, a vapor deposition device in accordance with an aspect of the present invention includes: a vapor deposition unit in accordance with an aspect of the present invention; and a moving device for, in a state where the vapor deposition mask of the vapor deposition unit faces the film formation target substrate, moving at least one of the vapor deposition unit and the film formation target substrate relative to the other thereof in a scanning direction which is perpendicular to the direction in which the first limiting plates are arranged, as viewed in the direction perpendicular to the principal surface of the vapor deposition mask, the vapor deposition mask having a width in the scanning direction which width is smaller than a width of the film formation target substrate in the scanning direction, the vapor deposition device, while scanning the film formation target substrate in the scanning direction, causing the vapor deposition particles injected through the first openings to be vapor-deposited onto the film formation target substrate through the limiting plate unit and the vapor deposition mask.

Still further, in order to solve the above problems, a vapor deposition method in accordance with an aspect of the present invention is a vapor deposition method for forming, on a film formation target substrate, a vapor-deposited film having a predetermined pattern by using the vapor deposition device in accordance with an aspect of the present invention, the vapor deposition method including: a placement step of placing the vapor deposition mask of the vapor deposition unit and the film formation target substrate so as to face each other while being spaced away from each other by a certain distance; a deposition step of, while moving at least one of the vapor deposition unit and the film formation target substrate relative to the other in a direction perpendicular to the direction in which the first limiting plates are arranged as viewed in the direction perpendicular to the principal surface of the vapor deposition mask, causing the vapor deposition particles injected through the first openings to be deposited onto the film formation target substrate through the limiting plate unit and the vapor deposition mask, the deposition step injecting the vapor deposition particles through the first openings toward the film formation target substrate while pressure in the vapor deposition source is relieved by the at least one second opening.

Advantageous Effects of Invention

According to an aspect of the present invention, it is possible to provide a vapor deposition unit, a vapor deposition device, and a vapor deposition method each of which allows the at least one second opening to relieve pressure at the film formation, with the result that it is possible to, by a simple technique, prevent an increase in pressure at and near the first openings and prevent the occurrence of abnormal film formation.

Figure 4:
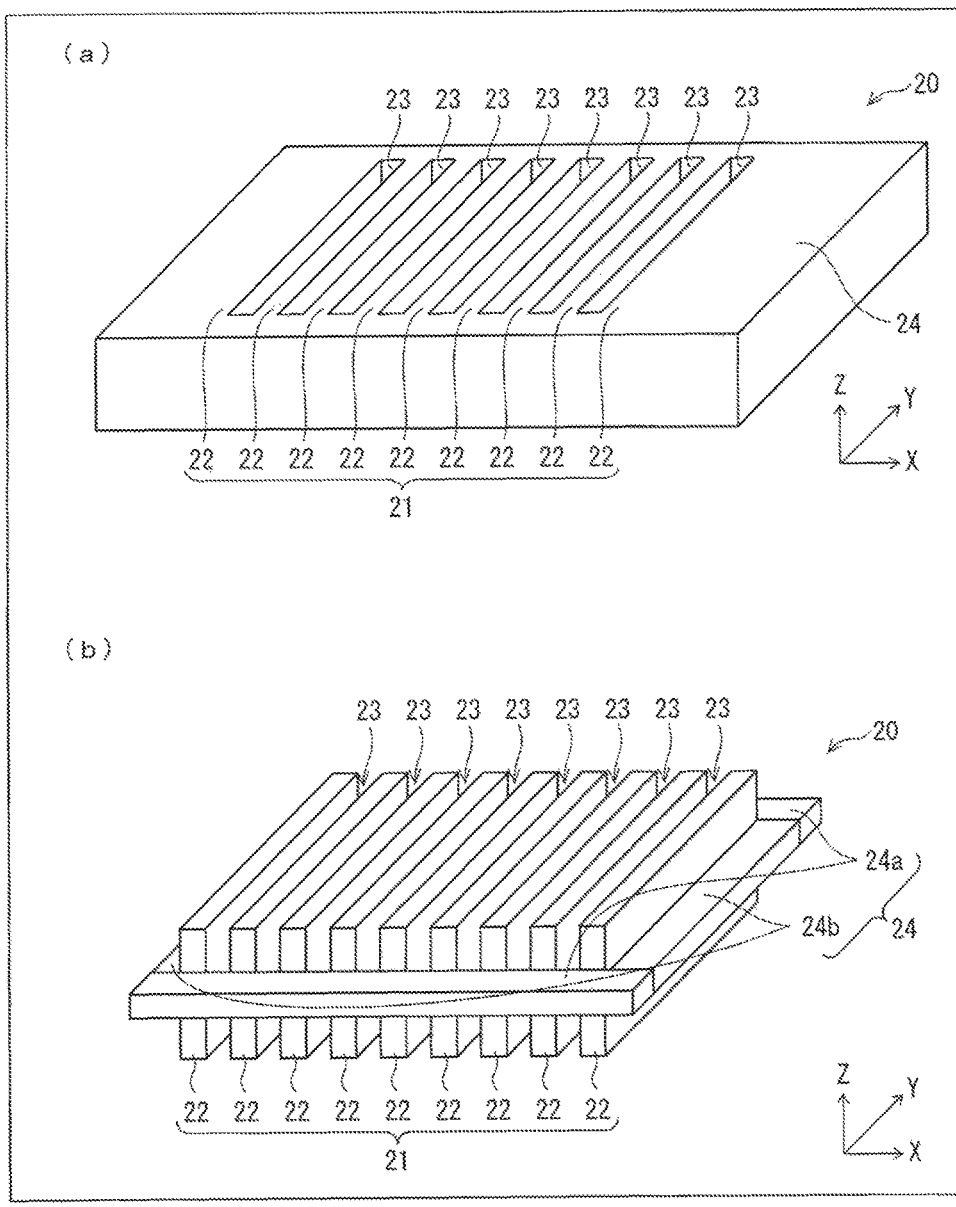

(a) and (b) of FIG. 4 are each a perspective view illustrating a configuration example of a limiting plate unit in the vapor deposition unit in accordance with Embodiment 1 of the present invention.

Figure 5:
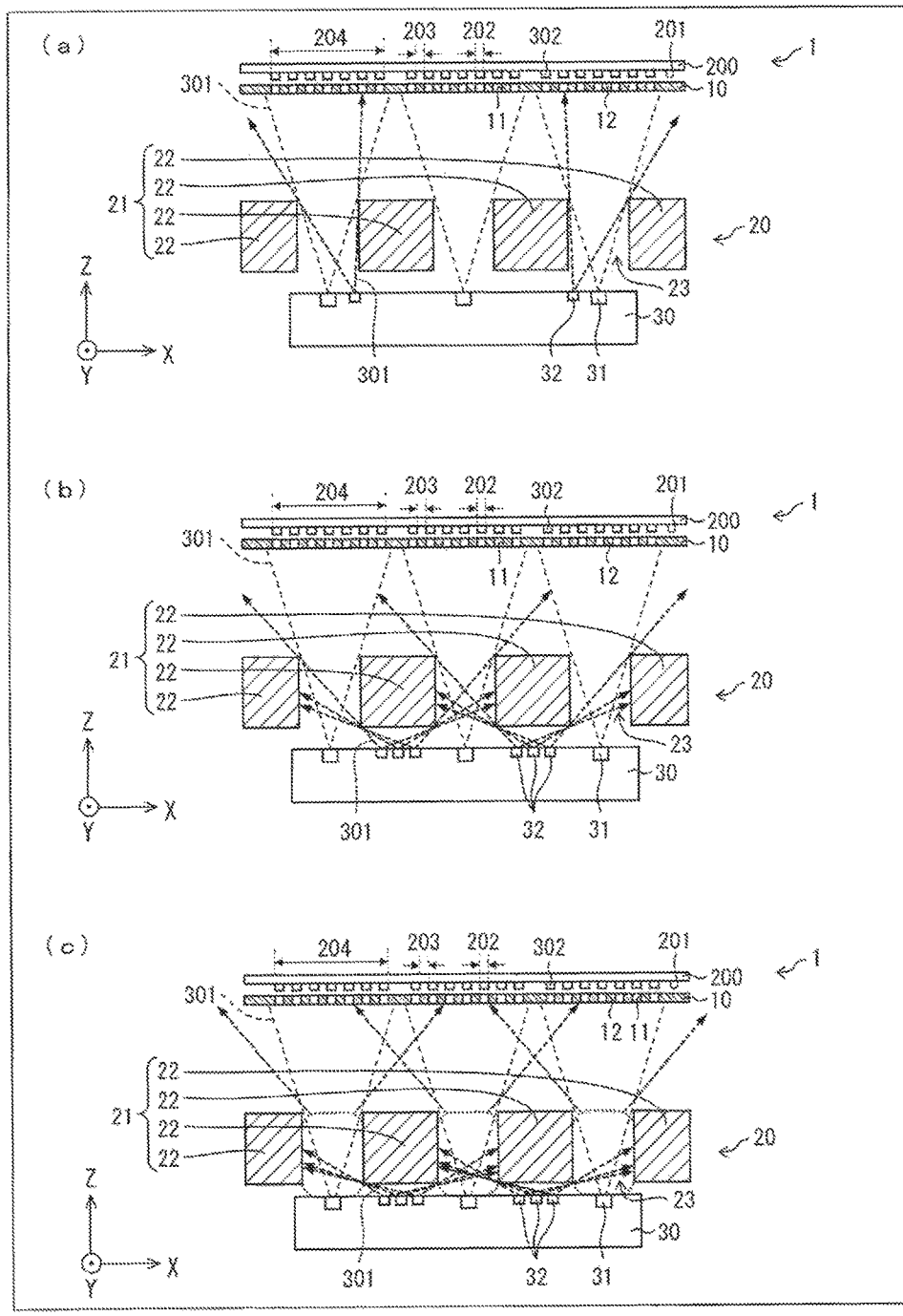

(a) to (c) of FIG. 5 are each a cross-sectional view illustrating a substantial part of a vapor deposition unit in accordance with Embodiment 1 of the present invention and illustrating a relation between a position where each of the second openings of the vapor deposition source is provided and a path on which vapor deposition particles are scattered.

Figure 6:
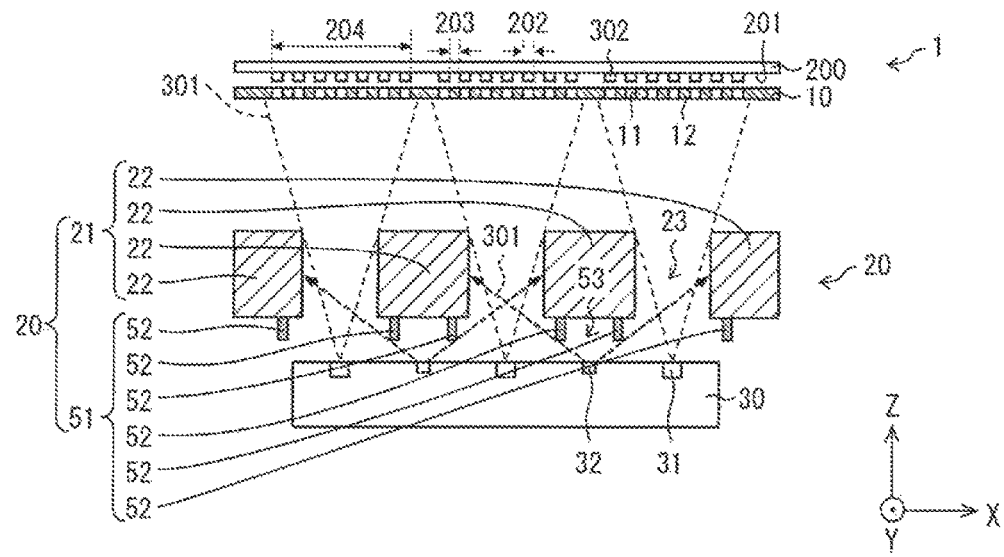

FIG. 6 is a cross-sectional view schematically illustrating an example configuration of a substantial part of a vapor deposition unit in accordance with Embodiment 2 of the present invention together with a film formation target substrate.

Figure 1:
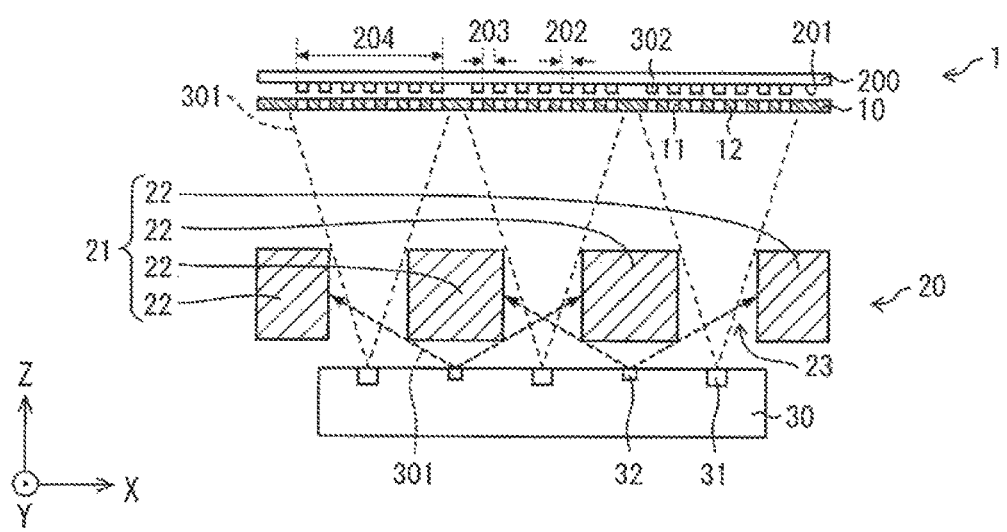
FIG. 1 is a cross-sectional view schematically illustrating an example configuration of a substantial part of a vapor deposition unit in accordance with Embodiment 1 of the present invention together with a film formation target substrate.
Figure 7:
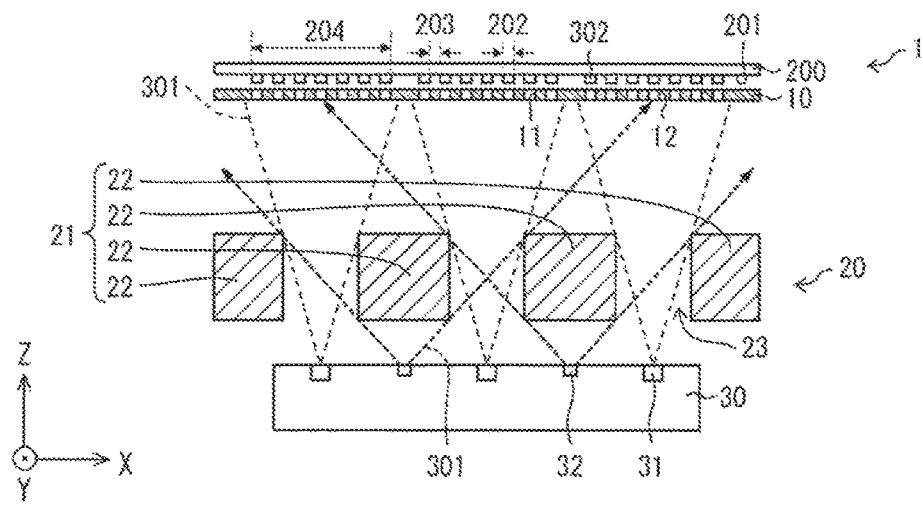

FIG. 7 is a cross-sectional view schematically illustrating a substantial part of the vapor deposition unit in which an angle at which vapor deposition particles having been injected through the second openings are scattered is different from that illustrated in FIG. 1 in the vapor deposition unit in accordance with Embodiment 1.

Figure 8:
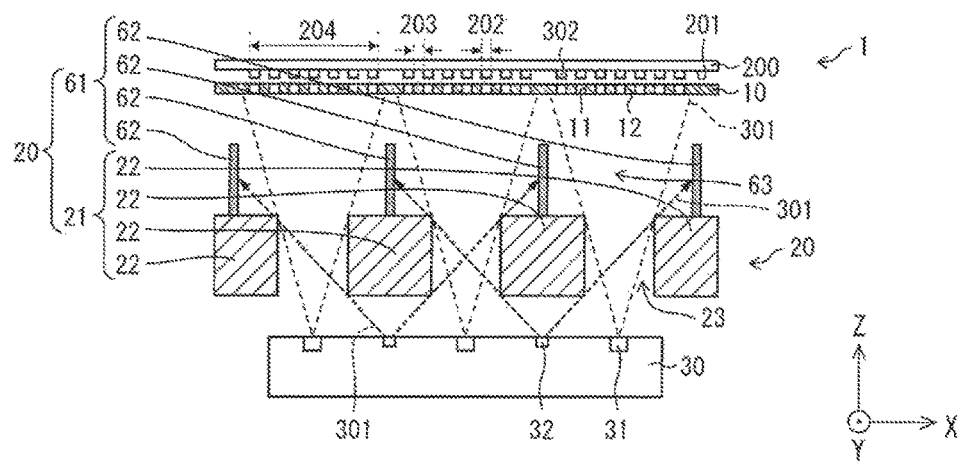

FIG. 8 is a cross-sectional view schematically illustrating an example configuration of a substantial part of a vapor deposition unit in accordance with Embodiment 2 of the present invention together with a film formation target substrate.

Figure 9:
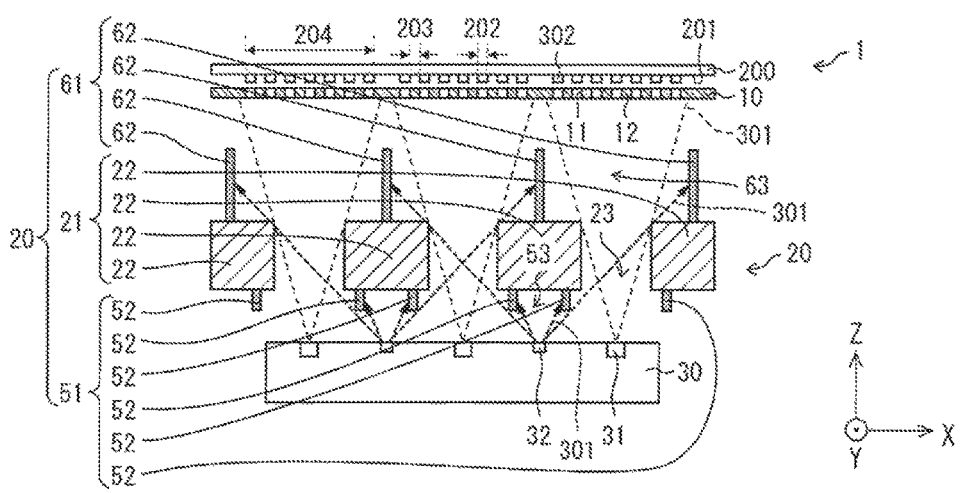

FIG. 9 is a cross-sectional view schematically illustrating an example configuration of a substantial part of a vapor deposition unit in accordance with a variation of Embodiment 2 of the present invention together with a film formation target substrate.

(a) and (b) of FIG. 10 are each a view schematically illustrating how vapor deposition flows vary depending on the difference in the vapor deposition density in a case where a plurality of limiting plates arranged along a direction perpendicular to a scanning direction are provided, in a plan view, between a vapor deposition source and a vapor deposition mask.

DESCRIPTION OF EMBODIMENTS

The description below deals in detail with example embodiments of the present invention.

[Embodiment 1]

The description below deals with an embodiment of the present invention with reference to FIG. 1 through (a) to (c) of FIG. 5.

Figure 2:
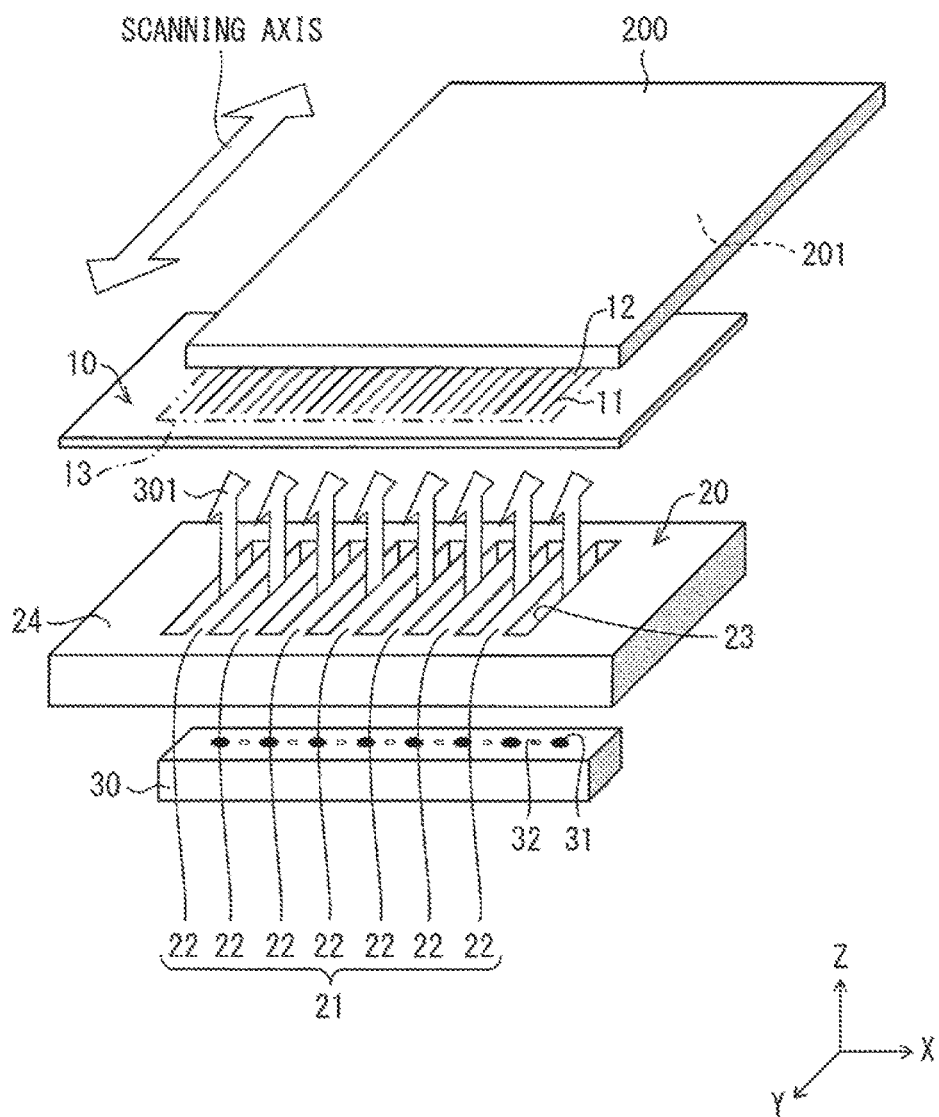
FIG. 2 is a perspective view schematically illustrating an example configuration of a substantial part of a vapor deposition unit in accordance with Embodiment 1 of the present invention together with a film formation target substrate.
Figure 3:
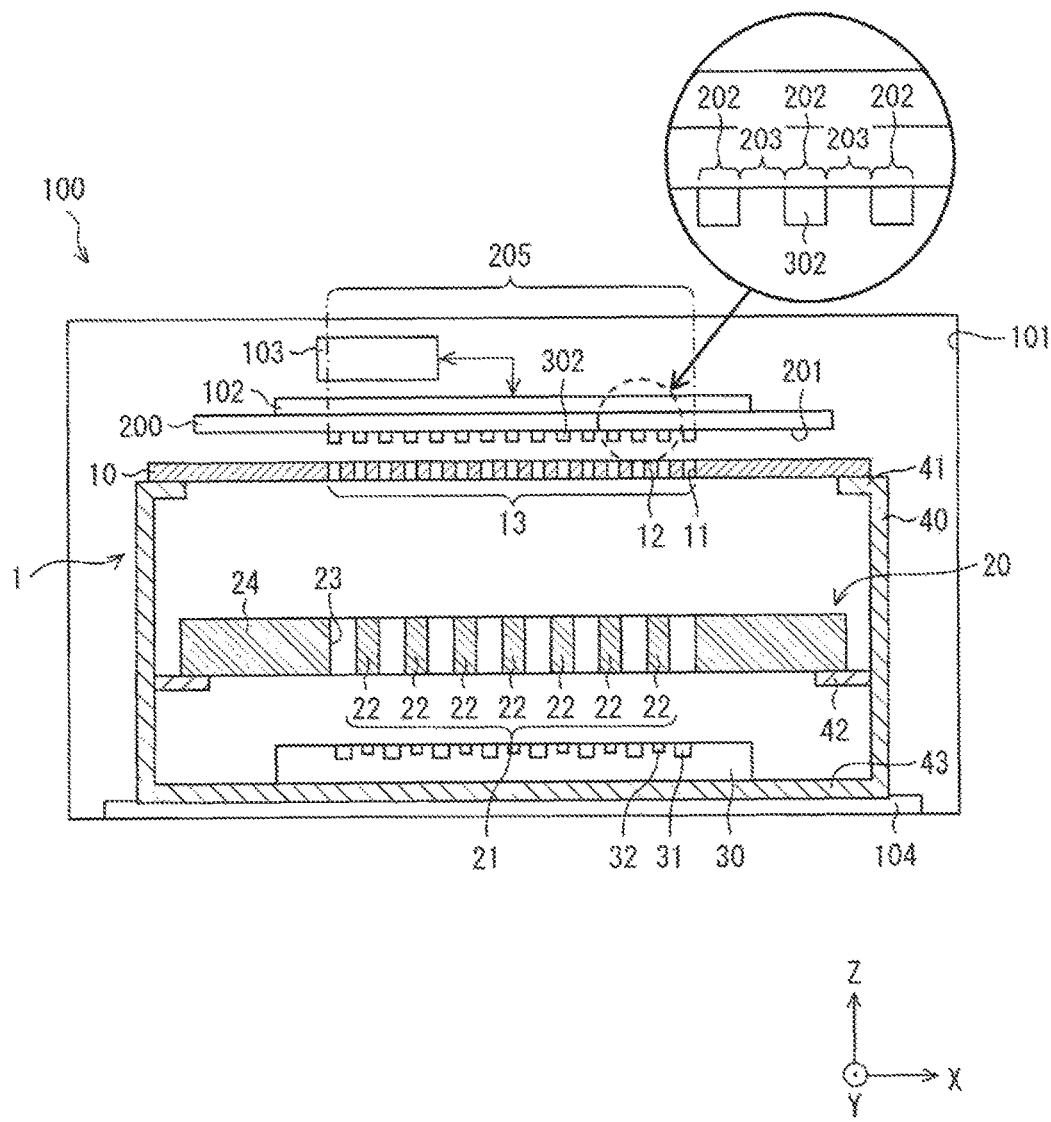
FIG. 3 is a cross-sectional view schematically illustrating an example configuration of a substantial part of a vapor deposition device which includes the vapor deposition unit in accordance with Embodiment 1 of the present invention.

FIG. 1 is a cross-sectional view schematically illustrating an example configuration of a substantial part of a vapor deposition unit 1 in accordance with Embodiment 1 together with a film formation target substrate 200. Further, FIG. 2 is a perspective view schematically illustrating an example configuration of a substantial part of the vapor deposition unit 1 in accordance with Embodiment 1 together with the film formation target substrate 200. FIG. 3 is a cross-sectional view schematically illustrating an example configuration of a substantial part of a vapor deposition device 100 which includes the vapor deposition unit 1 in accordance with Embodiment 1.

Note that the following description also assumes that (i) a Y axis is a horizontal axis extending in a scanning direction (scanning axis) of the film formation target substrate 200, (ii) an X axis is a horizontal axis extending in a direction perpendicular to the scanning direction of the film formation target substrate 200, and (iii) a Z axis is a vertical axis (up-and-down axis) which is perpendicular to each of the X axis and the Y axis, which is normal to a film formation target surface 201 of the film formation target substrate 200. Note also that, for convenience of description, the following description assumes that a side to which an arrow in a Z axis direction is directed (upper side in FIG. 1) is "top (upper side)", unless otherwise particularly mentioned.

<Schematic Configuration of Substantial Part of Vapor Deposition Unit 1>

The vapor deposition unit 1 in accordance with Embodiment 1, as illustrated in FIGS. 1 through 3, includes a vapor deposition mask 10, a limiting plate unit 20, and a vapor deposition source 30.

The vapor deposition mask 10, the limiting plate unit 20, and the vapor deposition source 30 are arranged in this order from a film formation target substrate 200 side in the Z axis direction and are placed so as to face each other while being spaced away from each other by, for example, certain distances.

The vapor deposition device 100 is a vapor deposition device that carries out vapor deposition by a scanning vapor-deposition method. Thus, according to the vapor deposition device 100, at least one of the film formation target substrate 200 and the vapor deposition unit 1 is moved (scanned) relative to the other while a certain gap is secured between the vapor deposition mask 10 and the film formation target substrate 200.

With this configuration, relative positions of the vapor deposition mask 10, the limiting plate unit 20, and the vapor deposition source 30 are fixed. Thus, the vapor deposition mask 10, the limiting plate unit 20, and the vapor deposition source 30 can be held by a holding member (not illustrated) such as a single holder (e.g., a holder 40 illustrated in FIG. 3) or can be integrated with each other. In other words, the vapor deposition unit 1 can include the holder 40 which holds the vapor deposition mask 10, the limiting plate unit 20, and the vapor deposition source 30.

(Vapor Deposition Mask 10)

The vapor deposition mask 10 is, as illustrated in FIGS. 1 through 3, a plate-shaped member, and has a mask surface, which is a principal surface of the vapor deposition mask 10 and which is parallel to an XY plane. Scan vapor deposition is carried out by using, as the vapor deposition mask 10, a vapor deposition mask that is smaller in size at least in a Y axis direction than the film formation target substrate 200.

The principal surface of the vapor deposition mask 10 has a plurality of mask openings 11 (openings). The mask openings 11 are through holes and function as a passing section through which vapor deposition particles 301 (vapor deposition material) pass during vapor deposition. Meanwhile, areas other than the mask openings 11 in the vapor deposition mask 10 are non-opening sections 12 and function as a blocking section which blocks flows of the vapor deposition particles 301 during vapor deposition.

Each of the mask openings 11 is arranged so as to correspond to a part of a pattern of each vapor-deposited film 302 so that vapor deposition particles 301 are not deposited onto a non-film formation target area 203 other than an intended film formation pattern area 202, which corresponds to a pattern of each vapor-deposited film 302, in the film formation target substrate 200. Only the vapor deposition particles 301 that have passed through the plurality of mask openings 11 reach the film formation target substrate 200, so that a vapor-deposited film 302 having a pattern corresponding to the plurality of mask openings 11 is formed on the film formation target substrate 200.

Note that luminescent layers of an organic EL display device that are made of the vapor deposition material are vapor-deposited for each color of the luminescent layers during an organic EL vapor deposition process.

The vapor deposition mask 10 can be used as it is. Alternatively, the vapor deposition mask 10 can be fixed by a mask frame while tension is applied to the vapor deposition mask 10 in order to prevent self-weight bending of the vapor deposition mask 10. The mask frame is configured in a plan view such that it is externally shaped in quadrilateral and is as large as the vapor deposition mask 10 or is another notch larger than the vapor deposition mask 10.

(Limiting Plate Unit 20)

(a) and (b) of FIG. 4 are each a perspective view illustrating a configuration example of the limiting plate unit 20 in the vapor deposition unit 1.

The limiting plate unit 20 includes a limiting plate row 21 including a plurality of limiting plates 22 (first limiting plates) which are, in a plan view, spaced away from each other and are provided parallel to each other. Note that the "plan view" refers to when viewed from a direction perpendicular to the principal surface of the vapor deposition mask 10 (that is, a direction parallel to the Z axis).

The limiting plate unit 20 can be configured as illustrated in (a) of FIG. 4 or can be configured as illustrated in (b) of FIG. 4.

The limiting plate unit 20 illustrated in (a) of FIG. 4 is a block-like unit and is configured such that a single quadrilateral plate having a principal surface on a XY plane and having a long axis in an X axis direction has a plurality of limiting plate openings 23 provided along the X axis direction. Thus, the limiting plate unit 20 illustrated in (a) of FIG. 4 is configured such that a plurality of limiting plates 22 are each provided between each adjacent two of the limiting plate openings 23 and are arranged along the X axis direction. In (a) of FIG. 4, in a part (that is, a non-opening section) other than the limiting plate openings 23 in the single plate, which serves as a component of the limiting plate unit 20, a frame-shaped holding body 24 and the limiting plates 22 are integrated with each other.

Meanwhile, the limiting plate unit 20 illustrated in (b) of FIG. 4 is configured such that the limiting plates 22 spaced away from each other by the limiting plate openings 23 are secured to the frame-shaped holding body 24 by using screws or by welding or other method, wherein the frame-shaped holding body 24 includes a pair of first holding members 24a parallel to the X axis direction and a pair of second holding members 24b parallel to a Y axis direction.

Thus, the limiting plates 22 can be integrally provided as illustrated in (a) of FIG. 4 or can be independently provided as illustrated in (b) of FIG. 4, and the limiting plates 22 can be integrated with the holding body 24 as illustrated in (a) of FIG. 4 or can be independent from the holding body 24 as illustrated in (b) of FIG. 4.

The method for holding the limiting plates 22 is not limited to the above method, and may be any method that allows constant relative positions and orientations of the limiting plates 22 to be maintained.

FIG. 2 illustrates an example case in which the limiting plate unit 20 illustrated in (a) of FIG. 4 is used. Providing the limiting plate unit 20 in the shape of a block as illustrated in FIG. 2 and (a) of FIG. 4 has an advantage in, for example, facilitating alignment of the limiting plates 22 and replacement of the limiting plate unit 20.

The limiting plates 22 each have a principal surface on a YZ plane. The respective principal surfaces of the limiting plates 22 are adjacent to each other in the X axis direction. The limiting plates 22 are so oriented as to be perpendicular to (i) the mask surface of the vapor deposition mask 10 and (ii) the film formation target surface 201 of the film formation target substrate 200. Further, in a plan view, the limiting plates 22 each extend parallel to the Y axis, and are arranged in the X axis direction at an equal pitch. Thus, the limiting plates 22 are each so oriented as to have a long axis parallel to the Y axis direction and have a short axis parallel to the Z axis direction.

The limiting plate openings 23 are arranged at a pitch larger than that of the mask openings 11 such that in a plan view, a plurality of mask openings 11 are positioned between two limiting plates 22 adjacent to each other in the X axis direction.

The limiting plate unit 20 partitions a space between the vapor deposition mask 10 and the vapor deposition source 30 into a plurality of vapor deposition spaces, that is, the limiting plate openings 23, with use of the limiting plates 22. The limiting plate unit 20, with this configuration, limits the angle at which vapor deposition particles 301 injected by the vapor deposition source 30 pass through the limiting plate unit 20.

A high vapor deposition density lets vapor deposition flows spread widely. Preventing spread of vapor deposition flows thus requires such spread of vapor deposition flows to be narrowed three-dimensionally.

Vapor deposition particles 301 injected by the vapor deposition source 30 pass through the limiting plate openings 23 and the mask openings 11 of the vapor deposition mask 10 sequentially to be vapor-deposited onto the film formation target substrate 200.

The limiting plate unit 20 selectively blocks (captures) vapor deposition particles 301 having entered the limiting plate unit 20, depending on the entry angle, as illustrated in FIG. 1. The limiting plate unit 20, in other words, captures at least part of vapor deposition particles 301 having collided with the limiting plates 22, and thereby limits movement of vapor deposition particles 301 in the direction in which the limiting plates 22 are arranged (that is, the X axis direction and oblique directions).

With the above arrangement, the limiting plate unit 20 (i) limits, to a predetermined range, the angle at which vapor deposition particles 301 enter the mask openings 11 of the vapor deposition mask 10, and thus (ii) prevents deposition, onto the film formation target substrate 200, of vapor deposition particles 301 flying toward the film formation target substrate 200 in oblique directions.

A height of the limiting plates 22 (thickness in the Z axis direction; in other words, an opening length of the limiting plate openings 23 in the Z axis direction), a width of the limiting plates 22 (thickness in the X axis direction), and an opening width of the limiting plate openings 23 in the X axis direction are not particularly limited and can be so set appropriately that a vapor-deposited film 302 having a predetermined pattern is formed on the film formation target surface 201 of the film formation target substrate 200 in each region 204 (ii) which is defined by a corresponding one of the limiting plate openings 23 and a corresponding one of the mask openings 11 and (ii) which corresponds to each of the first openings 31.

Note that the limiting plates 22 are unheated or are cooled so as to block (capture) obliquely scattering vapor deposition components. This arrangement allows the limiting plates 22 to have a temperature lower than a vapor deposition particle generation temperature at which a vapor deposition material turns into gas.

Thus, the limiting plate unit 20 may be provided with a cooling mechanism (not illustrated) for cooling the limiting plates 22. This arrangement allows vapor deposition particles 301 having collided with the limiting plates 22 to be solidified and captured. This makes it possible to prevent collision of vapor deposition particles 301 with each other and scattering of the vapor deposition particles 301. This consequently allows the traveling direction of the vapor deposition particles 301 to be closer to the direction normal to the film formation target substrate 200 and allows formation of an abnormally patterned film to be further prevented.

(Vapor Deposition Source 30)

The vapor deposition source 30 is a container containing, for example, a vapor deposition material. The vapor deposition source 30 may be a container directly containing a vapor deposition material, or may alternatively include a load-lock pipe so that a vapor deposition material is externally supplied to the vapor deposition source 30.

As illustrated in FIGS. 1 to 3, the vapor deposition source 30 has, for example, a quadrilateral shape. The vapor deposition source 30 has a top surface (that is, a surface facing the limiting plate unit 20 and the vapor deposition mask 10) having a plurality of first openings 31 and a plurality of second openings 32.

As illustrated in FIG. 1, the first openings 31 and the second openings 32 are injection holes (through holes, nozzles) from which vapor deposition particles 301 are injected.

The vapor deposition source 30 generates vapor deposition particles 301 in the form of a gas by heating a vapor deposition material so that the vapor deposition material is evaporated (in a case where the vapor deposition material is a liquid material) or sublimated (in a case where the vapor deposition material is a solid material). The vapor deposition source 30 injects the gaseous vapor deposition material as vapor deposition particles 301 to the outside of the vapor deposition source 30 through the first openings 31 and the second openings 32.

The first openings 31 are each an opening for forming the vapor-deposited film 302 on the film formation target substrate 200 and are provided such that, in a plan view, each of the first openings 31 is located in a corresponding one of gaps between the limiting plates 22 so as to overlap a corresponding one of the limiting plate openings 23. Thus, most of the vapor deposition particles 301 (vapor deposition flow) injected through each of the first openings 31 pass through a corresponding one of the limiting plate openings 23.

The vapor deposition particles 301 injected through each of the first openings 31 temporarily spread isotopically. Then, the vapor deposition particles 301 having spread toward opposite ends in the X axis direction and collided with the limiting plates 22 are blocked by the limiting plates 22, while the others pass through the limiting plate openings 23. The vapor deposition particles 301 having passed through the limiting plate openings 23 pass through the mask openings 11 of the vapor deposition mask 10 and are then deposited onto the film formation target surface 201 of the film formation target substrate 200. In this manner, a vapor-deposited film 302 having a predetermined pattern is formed on the film formation target surface 201 in the film formation pattern area 202 of each region 204 (i) which is defined by a corresponding one of the limiting plate openings 23 and a corresponding one of the mask openings 11 and (ii) which corresponds to each of the first openings 31.

The second openings 32 are pressure release openings (pressure release holes) which relieve pressure in the vapor deposition source 30 to the outside. The second openings 32 are each provided between the first openings 31 so as to face (overlap) the corresponding limiting plates 22 in a plan view. Vapor deposition particles 301 injected through the second openings 32 never reach the vapor deposition mask and the film formation target substrate 200 since all of these vapor deposition particles 301 are blocked by side surfaces of each of the limiting plates 22 and bottom surfaces of the limiting plates 22 as indicated by arrows in FIG. 1. Thus, the vapor deposition particles 301 injected through the second openings 32 never affect a film formation pattern on the film formation target surface 201.

That is, the second openings 32 are dummy openings that make no contribution to formation of the vapor-deposited film 302 on the film formation target substrate 200. Unlike the first openings 31, each of the second openings 32 is provided in such a position as not to face a gap between the corresponding limiting plates 22.

In Embodiment 1, the vapor deposition particles 301 in the vapor deposition source 30 pass through either the first openings 31 or the second openings 32. In Embodiment 1, the second openings 32 relieve pressure at the film formation. This makes it possible to prevent a locally increased vapor deposition density at the first openings 31.

Thus, Embodiment 1 makes it possible to prevent an increase in pressure at and near the first openings 31, especially a sharp increase in pressure at and near the first openings 31 at a high vapor deposition rate, by using a simple technique, without having to establish a complicated system as disclosed in Patent Literature 2. Therefore, Embodiment 1 makes it possible to prevent a pseudo-spread of the first openings 31 by using a simple technique while achieving the high vapor deposition rate. Consequently, Embodiment 1, by using a simple technique, makes it possible to prevent the occurrence of abnormal film formation such as formation of abnormally patterned vapor-deposited film 303 (see (b) of FIG. 10) between normally patterned vapor-deposited films 302, and makes it possible to form a high-definition pattern of the vapor-deposited film 302.

<Placement and Opening Diameters of First Openings 31 and Second Openings 32>

Next, placement and opening diameters of the first openings 31 and the second openings 32 are described below.

The first openings 31 are arranged at a fixed pitch in the X axis direction, and the second openings 32 are arranged at a fixed pitch in the X axis direction.

As illustrated in FIGS. 1 to 3, the first openings 31 are placed in a one-to-one correspondence with the limiting plate openings 23. For example, each of the first openings 31 is located, in a plan view, in the center of a corresponding one of the limiting plate openings 23 (in the center both in the X axis direction and in the Y axis direction).

Note that FIG. 2 illustrates an example case in which the first openings 31 and the second openings 32 are arranged one-dimensionally (that is, in a linear manner) in the X axis direction. Alternatively, the first openings 31 and the second openings 32 may be arranged two-dimensionally (that is, in a planar manner [so as to be tiled]). Even in a case where the first openings 31 are arranged two-dimensionally, each of the first openings 31 is placed so as to be located in the center of a corresponding one of the limiting plate openings 23 in the X axis direction (that is, in the center of a gap in the X axis direction between corresponding two adjacent ones of the limiting plates 22, between which a corresponding one of the first openings 31 is provided in the X axis direction).

There are no particular restrictions on the opening diameter (opening size) and number of the first openings 31. The vapor deposition mask 10 has a plurality of mask openings 11 (slits) which are provided in the X axis direction perpendicular to a scan axis direction so as to correspond to the plurality of first openings 31. A group of these mask openings 11 forms a single mask opening group region 13. The opening diameter (opening size) and number of the first openings 31 can be so set appropriately, according to a dimension of a film formation target region 205 of the film formation target substrate 200 in the X axis direction which region 205 corresponds to the mask opening group region 13, that a desired vapor deposition density (vapor deposition rate) would be obtained.

(a) to (c) of FIG. 5 are each a cross-sectional view illustrating a substantial part of a vapor deposition unit 1 and illustrating a relation between a position where each of the second openings 32 of the vapor deposition source 30 is provided and a path on which vapor deposition particles 301 are scattered.

As described earlier, each of the second openings 32 is provided in such a position as not to face a gap between the corresponding limiting plates 22.

In FIGS. 1 to 3, the second openings 32 are arranged in a one-to-one correspondence with the limiting plates 22, and one each of the second openings 32 is arranged between the first openings 31 so as to overlap a corresponding one of the limiting plates 22 in a plan view.

However, in a case where one each of the second openings 32 is arranged between the first openings 31 in a plan view by providing the second openings 32 in gaps between the limiting plates 22 so as to be close to the first openings 31 in a plan view, vapor deposition particles 301 having been injected through the second openings 32 pass through the gaps between the limiting plates 22, that is, through the limiting plate openings 23, as indicated by two-dot chain lines in (a) of FIG. 5.

The above configuration may cause vapor deposition particles 301 having been injected through the second openings 32 but having not been blocked by the limiting plates 22 to form an abnormally patterned vapor-deposited film 300. The above configuration may also cause vapor deposition particles 301 having been injected through the second openings 32 to reach regions, in the film formation target substrate 200, where vapor-deposited films 302 are to be formed by the vapor deposition particles 301 having been injected through the first openings 31. This may lead to, for example, a pattern blur.

Thus, each of the second openings 32 is provided in such a position as not to face a gap between the corresponding limiting plates 22. In so doing, it is desirable that the second openings 32, in particular, are each placed so as not to contribute to formation of the vapor-deposited film 302 on the film formation target substrate 200. For example, it is desirable that the second openings 32 are each provided in such a position as not to contribute to formation of the vapor-deposited film 302 on the film formation target substrate 200. This will be discussed below in more detail.

In Embodiment 1, there is no restriction on the number of the second openings 32. However, in a case where a large number of second openings 32 are provided as illustrated in (b) of FIG. 5, part of vapor deposition particles 301 having been injected through the second openings 32 provided near gaps between the limiting plates 22 may pass through the gaps between the limiting plates 22 without having been blocked by the limiting plates 22.

One approach to blocking a component not being blocked by the limiting plates 22 is to extend the bottoms of the limiting plates 22 toward the vapor deposition source 30 as illustrated in (c) of FIG. 5. This approach, however, causes a narrower space between (i) the first openings 31 and the second openings 32 and (ii) the limiting plates 22 as illustrated in (c) of FIG. 5 and thus decreases the volume of a space in which vapor deposition particles 301 are scattered. This sharply increases pressures in the gap between the vapor deposition source 30 and the limiting plates 22 and in the limiting plate openings 23. This results in vapor deposition particles 301 more probably colliding with each other and being scattered. In consequence, although vapor deposition flows are limited with use of the limiting plates 22 to have directivity, the vapor deposition flows having passed through the limiting plate openings 23 may isotopically spread after passing through the limiting plate openings 23.

With a larger number of the second openings 32, an increase in pressure in the first openings 31 can be prevented more effectively, but material utilization efficiency becomes lower.

Thus, it is desirable that each one of the second openings 32 is placed, in a plan view, in a center of each space between the first openings 31 in the X axis direction. In other words, it is desirable that the second openings 32 are each located, in a plan view, in the center of a corresponding one of the limiting plates 22 in the X axis direction. For example, it is desirable that the second openings 32 are each located in the center of a corresponding one of the limiting plates 22 (that is, in respective centers both in the X axis direction and in the Y axis direction). The above configuration enables the limiting plates 22 to more reliably prevent the vapor deposition particles 301 having been injected through the second openings 32 from passing through gaps between the limiting plates 22 and then being deposited onto the film formation target substrate 200.

Alternatively, two or more second openings 32 can be placed between the first openings 31 in the X axis direction, provided that a pitch of the first openings 31, a height of the limiting plates 22 (thickness in the Z axis direction), and/or other design parameter(s) are adjusted.

Further, in Embodiment 1, there is no particular restriction on the opening diameter (opening size) of the second openings 32. However, the second openings 32 having a large opening diameter increase the volume of vapor deposition flows injected through the second openings 32 to a degree that cannot be ignored, and thus seriously impair material utilization efficiency.

Therefore, it is preferable that the opening diameter of the second openings 32 be smaller than that of the first openings 31. It is particularly preferable that the opening diameter (opening width) of the second openings 32 in the X axis direction be smaller than that of the first openings 31 in the X axis direction. This configuration achieves a decrease in volume of vapor deposition flows injected through the second openings 32 at the pressure release and thus enables the impairment of the material utilization efficiency to be prevented.

On the other hand, the second openings 32 having an opening diameter extremely smaller than that of the second openings 32 may cause clogging of the first openings 31. Thus, it is desirable that the opening diameter of the second openings 32 is not less than 100 μm. This allows the possibility of clogging of the second openings 32 to be decreased.

Note that FIG. 2 illustrates an example case in which the first openings 31 and the second openings 32 are circular in a plan view. However, the shapes of the first openings 31 and the second openings 32 are not limited to a specific shape. Thus, the opening diameter (opening size) represents an opening diameter in a cross section passing through a center of each opening. Therefore, in a case where the shape of each opening is a circle as described above, the opening diameter represents a diameter.

(Holder 40)

The holder 40 is a holding member for holding the vapor deposition mask 10, the limiting plate unit 20, and the vapor deposition source 30.

The configuration of the holder 40 is not particularly limited, provided that the holder 40 is capable of holding the vapor deposition mask 10, the limiting plate unit 20, and the vapor deposition source 30 such that relative positions of the vapor deposition mask 10, the limiting plate unit 20, and the vapor deposition source 30 are fixed.

FIG. 3 illustrates an example case in which vapor deposition is carried out onto the film formation target substrate 200 by use of the vapor deposition particles 301 injected upward as illustrated in FIG. 1 (up-deposition). Thus, in the example case illustrated in FIG. 3, the holder 40 includes a tray 41, a tray 42, and a tray 43 in this order from top to bottom, and the vapor deposition mask 10 is placed on the tray 41, the limiting plate unit 20 is placed on the tray 42, and the vapor deposition source 30 is placed on the tray 43.

Alternatively, for example, in a case where vapor deposition is carried out onto the film formation target substrate 200 by use of the vapor deposition particles 301 injected downward (down-deposition), the vapor deposition source 30, the limiting plate unit 20, and the vapor deposition mask 10, and the film formation target substrate 200 are arranged in this order from top to bottom. Further alternatively, in a case where the vapor deposition particles 301 injected in a lateral direction are vapor-deposited via the vapor deposition mask 10 in a state in which the film formation target surface 201 of the film formation target substrate 200 is in an upright position while facing the vapor deposition source 30 (side-deposition), the vapor deposition source 30, the limiting plate unit 20, the vapor deposition mask 10, and the film formation target substrate 200 are arranged in the same plane. As such, the arrangement of the vapor deposition source 30, the limiting plate unit 20, the vapor deposition mask 10, and the film formation target substrate 200 is changed appropriately depending on a direction in which the vapor deposition particles 301 are injected.

In order to facilitate alignment of the vapor deposition mask 10, the limiting plate unit 20, and the vapor deposition source 30 or facilitate attachment and detachment of these constituent elements, the holder 40 can optionally include a sliding mechanism (not illustrated) capable of sliding and being displaced in the Z axis direction and in the X axis direction. The sliding mechanism allows at least one of these constituent elements to be slidably held.

For example, the vapor deposition material, which is melted or evaporated upon heating, can be easily collected through a heat treatment. The vapor deposition mask 10, which is required to be high in accuracy of dimension such as an opening width and flatness, may be distorted through a heat treatment and thus cannot be heat-treated. However, the limiting plate unit 20, which is not required to be as high in accuracy of dimension as the vapor deposition mask 10, can be heat-treated, so that the vapor deposition material accumulated on the limiting plate unit 20 can be easily collected. Thus, with the limiting plate unit 20 detachably provided, it is possible to enhance material utilization efficiency. Further, it is desirable that the vapor deposition mask 10 is a consumable item and is replaced periodically.

Further, the vapor deposition unit 1 can optionally be configured such that the holder 40, for example, is provided with a tension mechanism (not illustrated) for applying tension to the vapor deposition mask 10. This configuration allows the holder 40 to apply tension to the vapor deposition mask 10 to hold the vapor deposition mask 10 horizontally, and consequently allows a relative positional relationship to be easily maintained between (i) the vapor deposition mask 10 and (ii) the limiting plate unit 20 and the vapor deposition source 30.

Further, the vapor deposition unit 1 can optionally be configured such that the holder 40, for example, is further provided with, for example, a deposition preventing plate (shielding plate) (not illustrated) and/or a shutter.

<Schematic Configuration of Vapor Deposition Device 100>

The following description will discuss, with reference to FIG. 3, an example of the vapor deposition device 100 including the vapor deposition unit 1.

FIG. 3 is a cross-sectional view schematically illustrating a configuration of a substantial part of the vapor deposition device 100 in accordance with Embodiment 1.

As illustrated in FIG. 3, the vapor deposition device 100 in accordance with Embodiment 1 is configured such that a substrate holder 102, a substrate moving device 103, the vapor deposition unit 1, and a vapor deposition unit moving device 104, and others are provided in a vacuum chamber 101, which serves as a film formation chamber.

(Vacuum Chamber 101)

In the vacuum chamber 101, a vacuum pump (not illustrated) is provided for vacuum-pumping the vacuum chamber 101 via an exhaust port (not illustrated) thereof to keep a vacuum in the vacuum chamber 101 during vapor deposition.

(Substrate Holder 102)

The substrate holder 102 is a substrate holding member for holding the film formation target substrate 200. The substrate holder 102 holds the film formation target substrate 200 such that the film formation target surface 201 is placed so as to face the vapor deposition mask 10 while being spaced away from the vapor deposition mask 10 by a certain distance.

For the substrate holder 102, it is preferable to use, for example, an electrostatic chuck. The film formation target substrate 200 fixed to the substrate holder 102 by means of an electrostatic chuck or the like can be held by the substrate holder 102 without being bent by its own weight.

(Substrate Moving Device 103 and Vapor Deposition Unit Moving Device 104)

Embodiment 1 is arranged to carry out scan vapor deposition by, with use of at least one of the substrate moving device 103 and the vapor deposition unit moving device 104, moving the film formation target substrate 200 and/or the vapor deposition unit 1 relative to the other in the scanning direction which corresponds to the Y axis direction.

The substrate moving device 103 includes, for example, a motor (not illustrated) and causes a motor drive control section (not illustrated) to drive the motor so as to move the film formation target substrate 200 held by the substrate holder 102. The vapor deposition unit moving device 104 includes, for example, a motor (not illustrated) and causes a motor drive control section (not illustrated) to drive the motor so as to move the vapor deposition unit 1 relative to the film formation target substrate 200.

Note, however, that at least one of the film formation target substrate 200 and the vapor deposition unit 1 only needs to be movable relative to the other. Thus, only at least one of the substrate moving device 103 and the vapor deposition unit moving device 104 can be provided. In other words, one of the film formation target substrate 200 and the vapor deposition unit 1 may be fixed to an inner wall of the vacuum chamber 101.

Note that the substrate moving device 103 and the vapor deposition unit moving device 104 can be any of various moving devices known to the public, such as a roller moving device or a hydraulic moving device.

<Vapor Deposition Method>

Next, the following description will discuss a vapor deposition method using the vapor deposition device 100.

First, the vapor deposition mask 10 of the vapor deposition unit 1 and the film formation target substrate 200 are placed so as to face each other while being spaced away from each other by a certain distance (placement step).

Note that in the placement step, individual alignment markers provided on the vapor deposition mask 10 and the film formation target substrate 200 are used so that relative alignment between the vapor deposition mask 10 and the film formation target substrate 200 (i.e., alignment adjustment) and adjustment of a gap between the vapor deposition mask 10 and the film formation target substrate 200 (gap control) are carried out.

Next, while at least one of the vapor deposition unit 1 and the film formation target substrate 200 is moved relative to the other in the scan axis direction (that is, the Y axis direction which is a direction perpendicular to the direction in which the limiting plates 22 are arranged) in a plan view, the vapor deposition particles 301 having been injected through the first openings 31 of the vapor deposition source 30 are deposited onto the film formation target substrate 200 through the limiting plate unit 20 and the mask openings 11 of the vapor deposition mask 10 (deposition step).

In Embodiment 1, in the deposition step, the vapor deposition particles 301 (vapor deposition flows) are injected through the first openings 31 toward the film formation target substrate 200 while pressure in the vapor deposition source 30 is relieved by the second openings 32 of the vapor deposition source 30.

Unnecessary components of the vapor deposition flows having been injected through the first openings 31 are blocked by the limiting plates 22. Subsequently, the remaining components pass through the vapor deposition mask 10 and are then deposited onto the film formation target substrate 200 to form a regularly patterned film. Meanwhile, the vapor deposition particles 301 having been injected through the second openings 32 are all blocked by the limiting plates 22 from reaching the film formation target substrate 200.

Thus, the limiting plate unit 20 has the following two functions: (1) a function of controlling isotropic vapor deposition flows having been injected through the first openings 31 by the vapor deposition source 30 so that directivity of these vapor deposition flows is increased; and (2) a function of blocking isotropic vapor deposition flows having been injected through the second openings 32 from reaching the film formation target substrate 200.

According to Embodiment 1, pressure is relieved by the second openings 32 at the film formation. This makes it possible to prevent a pseudo-spread of the first openings 31 and to form a vapor-deposited film 302 with a predetermined pattern on the film formation target surface 201 of the film formation target substrate 200 while preventing the occurrence of abnormally patterned vapor-deposited film 303 (see (b) of FIG. 10).

Note that examples of the vapor-deposited film 302 include selectively vapor-deposited layers (for example, respective luminescent layers of the individual colors) for an organic EL display device.

<Variations>

Note that Embodiment 1 has discussed the example case in which two or more second openings 32 are provided on the top surface of the vapor deposition source 30.

However, the second openings 32 are only required to be capable of relieving pressure in the vapor deposition source 30 to the outside. Thus, it is desirable that the second openings 32 are provided between the first openings 31 in order to reliably prevent a pseudo-spread of each of the first openings 31. However, the present invention is not limited to this configuration. It is essential that at least one second opening 32 is provided.

Note that Embodiment 1 has discussed the example case in which the second openings 32 are provided so as to face (overlap) the corresponding limiting plates 22. However, the second openings 32 are only required to (i) release pressure in the vapor deposition source 30 without having to establish a complicated system as disclosed in Patent Literature 2 and (ii) avoid the vapor deposition particles 301 having been injected through the second openings 32 from being deposited onto the film formation target substrate 200. Thus, the second openings 32 are not necessarily provided on the top surface of the vapor deposition source 30. Alternatively, the second openings 32 can be provided on a surface(s) which is not directed to the vapor deposition mask 10, such as a side surface(s) of the vapor deposition source 30.

[Embodiment 2]

The description below deals with another embodiment of the present invention with reference to FIGS. 6 and 7. The description below will deal mainly with how the present embodiment differs from Embodiment 1. Any member of the present embodiment that is identical in function to a corresponding member of Embodiment 1 is assigned a common reference numeral, and is not described here.

<Schematic Configuration of Vapor Deposition Unit 1>

FIG. 6 is a cross-sectional view schematically illustrating an example configuration of a substantial part of a vapor deposition unit 1 in accordance with Embodiment 2 together with a film formation target substrate 200.

As illustrated in FIG. 6, the vapor deposition unit 1 in accordance with Embodiment 2 is identical to the vapor deposition unit 1 in accordance with Embodiment 1, except that a limiting plate unit 20 includes a plurality of limiting plates 52 (second limiting plates) in a gap between the limiting plates 22 and the vapor deposition source 30.

FIG. 7 is a cross-sectional view schematically illustrating a substantial part of the vapor deposition unit 1 in which an angle at which vapor deposition particles 301 having been injected through the second openings 32 are scattered is different from that illustrated in FIG. 1 in the vapor deposition unit 1 in accordance with Embodiment 1.

In comparison with the vapor deposition unit 1 illustrated in FIG. 1, the vapor deposition unit 1 illustrated in FIG. 7 is larger in distance between the vapor deposition source 30 and the limiting plate unit 20 (that is, a distance between the vapor deposition source 30 and each of the limiting plates 22) and is larger in width of the limiting plates 22, but is lower in height of the limiting plates 22 (opening length of the limiting plate openings 23 in the Z axis direction).

Thus, in comparison with the vapor deposition unit 1 illustrated in FIG. 1, the vapor deposition unit 1 illustrated in FIG. 7 is smaller in angle between (i) a vapor deposition flow, injected through each of the second openings 32, passing near a lower end of each limiting plate 22 and directly entering each of the limiting plate openings 23 (in other words, a path on which the vapor deposition particles 301 enter each of the limiting plate openings 23) and (ii) a normal to a mask surface of the vapor deposition mask 10.

As such, an entry angle of the vapor deposition flow injected through each second opening 32 entering each limiting plate opening 23 varies depending on a design specification of the vapor deposition unit 1 (for example, individual opening sizes of the first openings 31 and the second openings 32, a pitch of the first openings 31, a pitch of the second openings 32, a distance between the vapor deposition source 30 and the limiting plate unit 20, an opening length of the limiting plate openings 23 in the Z axis direction, and an opening width of the limiting plate openings 23 in the X axis direction, and others).

As described earlier, there are no particular restrictions on the height and width of the limiting plates 22 and the opening width of the limiting plate openings 23 in the X axis direction. Note, however, that in order to decrease a width of a shadow in each film formation pattern area 202, it is desirable to, for example, increase the opening length of the limiting plate openings 23 in the Z axis direction, relative to the opening width of the limiting plate openings 23 in the X axis direction. In this case, decreasing the opening width of the limiting plates 22 in the X axis direction and increasing the height of the limiting plates 22 are considered as possible approaches.

However, decreasing the opening width of the limiting plates 22 in the X axis direction decreases an aperture ratio of the limiting plate unit 20 and increases the amount of vapor deposition material deposited onto the limiting plates 22. This tends to decrease an efficiency of utilization of the vapor deposition material. Meanwhile, increasing the height of the limiting plates 22 increases the weight of the limiting plates 22 and decreases the volume of a space in which vapor deposition particles 301 are scattered. This tends to result in vapor deposition particles 301 more probably colliding with each other and being scattered.

In general, organic EL display devices vary in pixel design from model to model. Accordingly, organic EL display devices vary in acceptable shadow width from model to model. Further, the size of the limiting plates 22 varies depending on the size of the film formation target substrate 200. Accordingly, the weight of the limiting plates 22 varies. Thus, a design of the vapor deposition unit 1 is changed in response to the need to reflect these various conditions.

However, depending on a design specification of the vapor deposition unit 1, not all the vapor deposition particles 301 having been injected through the second openings 32 can be blocked by the limiting plates 22 only, as illustrated in FIG. 7.

However, it is desirable that the limiting plate unit 20 and the second openings 32 are designed so that the vapor deposition particles 301 injected through the second openings 32 are blocked by the limiting plate unit 20 from reaching the vapor deposition mask 10.

In view of this, in Embodiment 2, a plurality of limiting plates 52 are provided between the limiting plates 22 and the vapor deposition source 30, as illustrated in FIG. 6, for blocking vapor deposition particles 301 which cannot be blocked by the limiting plates 22 only, of all the vapor deposition particles 301 injected through the second openings 32.

The limiting plates 52 are arranged such that at least two each of the limiting plates 52 are provided in the X axis direction for each of the limiting plates 22, and such that, in a plan view, the at least two each of the limiting plates 52 facing a corresponding one of the limiting plates 22 are provided on opposite sides of a corresponding second opening 32 facing the corresponding one of the limiting plates 22.

Assume that only one limiting plate 52 is provided for each of the limiting plates 22 or that, in a plan view, one or more limiting plates 52 are provided on only one of the opposite ends of the limiting plate 22 in the X axis direction, in a state in which the second opening 32 is provided between the opposite ends of the limiting plate 22. In either case, a vapor deposition flow having been injected through the second opening 32 and spread toward the other one of the opposite ends in the X axis direction cannot be blocked. In view of this, it is desirable that at least two limiting plates 52 are provided on the opposite ends of the limiting plate 22 in a state in which the second opening 32 is provided between the opposite ends of the limiting plate 22.

Similar to the limiting plates 22, the limiting plates 52 each have a principal surface on a YZ plane. The respective principal surfaces of the limiting plates 52 are adjacent to each other in the X axis direction. The limiting plates 52 are so oriented as to be perpendicular to (i) the mask surface of the vapor deposition mask 10 and (ii) the film formation target surface 201 of the film formation target substrate 200.

Thus, the limiting plate unit 20 includes a limiting plate row 51 between the limiting plates 22 and the vapor deposition source 30, the limiting plate row 51 including a plurality of limiting plates 52 which are, in a plan view, spaced away from each other and are provided parallel to each other. Note that similar to the limiting plates 22, the limiting plates 52 are each so oriented as to have a long axis parallel to the Y axis direction and have a short axis parallel to the Z axis direction.

Limiting plate openings 53 connected to the limiting plate openings 23 are each formed between the limiting plates 52 which are provided adjacent to each other on the limiting plates 22 adjacent to each other in the X axis direction (that is, between the limiting plates 52 between which the corresponding one of the limiting plate openings 23 is provided in a plan view).

Thus, in Embodiment 2, vapor deposition particles 301 (vapor deposition flows) having been injected through the first openings 31 pass through the limiting plate openings 53 and the limiting plate openings 23, pass through the mask openings 11, and are then deposited onto the film formation target substrate 200. Of the vapor deposition flows having been injected through the first openings 31, unnecessary components are blocked by the limiting plates 52 and the limiting plates 22 from passing through the limiting plate openings 53 and the limiting plate openings 23. Subsequently, the remaining components pass through the vapor deposition mask 10 and are then deposited onto the film formation target substrate 200 to form a regularly patterned film.

Meanwhile, the vapor deposition particles 301 (vapor deposition flows) having been injected through the second openings 32 are blocked by the limiting plates 52, and enter the limiting plate openings 23 at an angle restricted by the limiting plates 52. Thus, Embodiment 2 allows the limiting plates 52 to block vapor deposition flows from passing through the limiting plate openings 23. With this configuration, the vapor deposition particles 301 (vapor deposition flows) having been injected through the second openings 32 are all blocked by the limiting plates 52 and the limiting plates 22. In this manner, Embodiment 2 allows effectively blocking the vapor deposition flows which are injected through the second openings 32 and cannot be blocked by the limiting plates 22.

Note that each of the limiting plates 52 needs to be provided in such a position that the vapor deposition flow having been injected through the second openings 32 can be blocked. This is a geometrical parameter and can be calculated easily.

The limiting plates 52 are arranged such that at least two limiting plates 52 are provided in the X axis direction for each of the limiting plates 22. With this configuration, the limiting plates 52 have a width (that is, thickness in the X axis direction) smaller than that of the limiting plates 22.

Note that as in the case of the limiting plates 22, height and width of the limiting plates 52 can be set appropriately. However, too high and too wide the limiting plates 52 are not desirable because they narrow a space between the vapor deposition source 30 and the limiting plate unit 20. The limiting plates 52 preferably occupy as small a proportion (volume) as possible in the space between the vapor deposition source 30 and the limiting plate unit 20 so that vapor deposition flows having been injected through the second openings 32 will not have a vapor deposition distribution changed due to a sharp pressure change. Further, the larger the height and width of the limiting plates 52, the more the limiting plates 52 weigh. Thus, the height and width of the limiting plates 52 are preferably determined with the above point as well in mind.

Note that in any case, the proportion occupied by the limiting plates 52 in the space between the vapor deposition source 30 and the limiting plate unit 20 is smaller than a proportion occupied by limiting plates 22 having a bottom extended toward the vapor deposition source 30 as illustrated in (c) of FIG. 5, in a space between the vapor deposition source 30 and a limiting plate unit 20 having unextended limiting plates 22. Thus, a pressure difference between the configuration in which the limiting plates 52 are present between the vapor deposition source 30 and the limiting plates 22 and the configuration in which the limiting plates 52 are not present between the vapor deposition source 30 and the limiting plates 22 is smaller than a pressure difference between the configuration in which the respective bottoms of the limiting plates 22 are extended toward the vapor deposition source 30 and the configuration in which the respective bottoms of the limiting plates 22 are not extended toward the vapor deposition source 30.

Note that in Embodiment 2, the limiting plates 52 are provided close to the limiting plate openings 23 on a surface of the limiting plate 22 which surface faces the vapor deposition source 30. The arrangement in which the limiting plates 52 are provided on the opposite ends of each limiting plate 22 in the X axis direction or near the opposite ends thereof achieves a larger angle between (i) a vapor deposition flow, injected through the second opening 32, passing near a lower end of each limiting plate 22 and directly entering each of the limiting plate openings 23 and (ii) a normal to the mask surface of the vapor deposition mask 10, in comparison with the arrangement in which the limiting plates 52 are provided close to the center of the corresponding one of the limiting plates 22. Consequently, the limiting plates 52 enable effectively blocking of the vapor deposition particles 301 which enter the limiting plate openings 23.

Note that the limiting plates 52 can be secured on the lower surface of the corresponding one of the limiting plates 22 or can be integrated with the corresponding one of the limiting plates 22 by being integrally formed with the corresponding one of the limiting plates 22.

Alternatively, the limiting plate row 51 can be a block-like unit as illustrated in (a) of FIG. 4 or an assembly as illustrated in (b) of FIG. 4 and can be separate from the limiting plate row 21. That is, the limiting plate unit 20 can be an integral-type structure or can be a multistage unit having limiting plates at multiple stages.

Note that the limiting plates 52 can be secured on the lower surface of the corresponding one of the limiting plates 22 by any method. For example, the securing can be carried out with an adhesive agent or a tackiness agent or with a bonding member such as bolt and a screw. Further, the limiting plates 52 and the corresponding one of the limiting plates 22 can be integrally formed by any publicly known molding method such as casting or injection molding.

[Embodiment 3]

The description below deals with still another embodiment of the present invention with reference to FIGS. 8 and 9. The description below will deal mainly with how Embodiment 3 differs from Embodiments 1 and 2. Any member of embodiment 3 that is identical in function to a corresponding member of Embodiments 1 and 2 is assigned a common reference numeral, and is not described here.

<Schematic Configuration of Vapor Deposition Unit 1>

FIG. 8 is a cross-sectional view schematically illustrating an example configuration of a substantial part of a vapor deposition unit 1 in accordance with Embodiment 3 together with a film formation target substrate 200.

As illustrated in FIG. 8, the vapor deposition unit 1 in accordance with Embodiment 3 is identical to the vapor deposition unit 1 in accordance with Embodiment 1, except that a limiting plate unit 20 is provided with a limiting plate row 61 which includes a plurality of limiting plates 62 (third limiting plates) in a gap between the limiting plates 22 and the vapor deposition mask 10, wherein the limiting plates 62 are provided so as to face the limiting plates 22 while being spaced away from each other in a plan view.

As illustrated in FIG. 7 in the description of Embodiment 2, depending on a design specification of the vapor deposition unit 1, not all the vapor deposition particles 301 having been injected through the second openings 32 can be blocked by the limiting plates 22 only.

In view of this, in Embodiment 3, a plurality of limiting plates 62 are provided between the limiting plates 22 and the vapor deposition mask 10, as illustrated in FIG. 8, for blocking vapor deposition particles 301 which cannot be blocked by the limiting plates 22 only, of all the vapor deposition particles 301 injected through the second openings 32.

Similar to the limiting plates 22, the limiting plates 62 each have a principal surface on a YZ plane. The respective principal surfaces of the limiting plates 62 are adjacent to each other in the X axis direction. The limiting plates 62 are so oriented as to be perpendicular to (i) the mask surface of the vapor deposition mask 10 and (ii) the film formation target surface 201 of the film formation target substrate 200. Thus, the limiting plates 62 are provided parallel to each other. Similar to the limiting plates 22, the limiting plates 62 are each so oriented as to have a long axis parallel to the Y axis direction and have a short axis parallel to the Z axis direction.

Limiting plate openings 63 connected to the limiting plate openings 23 are each formed between the limiting plates 62 which are provided adjacent to each other on the limiting plates 22 adjacent to each other in the X axis direction (that is, between the limiting plates 62 between which the corresponding one of the limiting plate openings 23 is provided in a plan view).

Thus, in Embodiment 3, vapor deposition particles 301 (vapor deposition flows) having been injected through the first openings 31 pass through the limiting plate openings 23 and the limiting plate openings 63, pass through the mask openings 11, and are then deposited onto the film formation target substrate 200. Of the vapor deposition flows having been injected through the first openings 31, unnecessary components are blocked by the limiting plates 22 and the limiting plates 62 from passing through the limiting plate openings 23 and the limiting plate openings 63. Subsequently, the remaining components pass through the vapor deposition mask 10 and are then deposited onto the film formation target substrate 200 to form a regularly patterned film.

Meanwhile, the vapor deposition particles 301 (vapor deposition flows) having been injected through the second openings 32 are mostly blocked by the limiting plates 22. Then, the vapor deposition particles 301 (vapor deposition flows) having been injected through the second openings 32 and having passed through the limiting plate openings 23 without having been blocked by the limiting plates 22 are blocked by the limiting plates 62. With this configuration, the vapor deposition particles 301 (vapor deposition flows) having been injected through the second openings 32 are all blocked by the limiting plates 22 and the limiting plates 62. In this manner, Embodiment 3 allows effectively blocking the vapor deposition flows which are injected through the second openings 32 and cannot be blocked by the limiting plates 22.

Note that each of the limiting plates 62 needs to be provided in such a position that the vapor deposition flows having been injected through the second openings 32 can be blocked. This is a geometrical parameter and can be calculated easily. Thus, although the positions of the limiting plates 62 are not limited to specific positions, each of the limiting plates 62 only needs to be provided, in a plan view, in a midsection between the limiting plate openings 23 which are adjacent to each other in the X axis direction, that is, in a center of a corresponding one of the limiting plates 22 in the X axis direction. Consequently, the configuration of Embodiment 3, which is simpler than that of Embodiment 2 in which two limiting plates 52 are provided for each of the limiting plates 22, enables the limiting plates 62 few in number to effectively block the vapor deposition flows having been injected through the second openings 32 and then passed through the limiting plate openings 23. Further, the vapor deposition unit 1 in accordance with Embodiment 3 is more effective since the vapor deposition unit 1 in accordance with Embodiment 3, unlike the vapor deposition unit 1 in accordance with Embodiment 2, does not reduce a space between the vapor deposition source 30 and the limiting plate unit 20.

As illustrated in FIG. 8, the limiting plates 62 are formed such that a width of the limiting plates 62 (that is, thickness in the X axis direction) is smaller than that of the limiting plates 22.

Note that as in the case of the limiting plates 22, height and width of the limiting plates 62 can be set appropriately. However, too high and too wide the limiting plates 62 are not desirable because they narrow a space between the limiting plate unit 20 and the vapor deposition mask 10. The limiting plates 62 preferably occupy as small a proportion (volume) as possible in the space between the limiting plate unit 20 and the vapor deposition mask 10 so that the vapor deposition flows having been injected through the first openings 31 and passed through the limiting plate openings 23 will not have a vapor deposition distribution changed due to a sharp pressure change. Thus, the height and width of the limiting plates 62 are preferably determined with the above point as well in mind.

Note that in any case, the proportion occupied by the limiting plates 62 in the space between the limiting plate unit 20 and the vapor deposition mask 10 is smaller than a proportion occupied by limiting plates 22 having a upper portion extended toward the vapor deposition mask 10, in a space between the vapor deposition mask 10 and a limiting plate unit 20 having unextended limiting plates 22. Thus, a pressure difference between the configuration in which the limiting plates 62 are present between the limiting plate unit 20 and the vapor deposition mask 10 and the configuration in which the limiting plates 62 are not present between the limiting plate unit 20 and the vapor deposition mask 10 is smaller than a pressure difference between the configuration in which the respective upper portions of the limiting plates 22 are extended toward the vapor deposition mask 10 and the configuration in which the respective upper portions of the limiting plates 22 are not extended toward the vapor deposition mask 10.

Note that the limiting plates 62 can be secured on the upper surface of the corresponding one of the limiting plates 22 or can be integrated with the corresponding one of the limiting plates 22 by being integrally formed with the corresponding one of the limiting plates 22.

Alternatively, the limiting plate row 61 can be a block-like unit as illustrated in (a) of FIG. 4 or an assembly as illustrated in (b) of FIG. 4 and can be separate from the limiting plate row 21. That is, in Embodiment 3 as in Embodiment 2, the limiting plate unit 20 can be an integral-type structure or can be a multistage unit having limiting plates at multiple stages.

<Variation>

FIG. 9 is a cross-sectional view schematically illustrating an example configuration of a substantial part of a vapor deposition unit 1 in accordance with a variation of Embodiment 3 together with a film formation target substrate 200.

As illustrated in FIG. 9, the limiting plate unit 20 as illustrated in FIG. 8 can be combined with the limiting plates 52 illustrated in FIG. 6.

The limiting plate unit 20 configured such that the limiting plates 52 and the limiting plate 62 are provided for each of the limiting plates 22 as illustrated in FIG. 9, enables more reliable blocking of the vapor deposition flows injected through the second openings 32.

[Recap]

In a first aspect of the present invention, a vapor deposition unit 1 is a vapor deposition unit for forming, on a film formation target substrate 200, a vapor-deposited film 302 having a predetermined pattern, and includes: a vapor deposition source 30; a vapor deposition mask 10 placed between the vapor deposition source 30 and the film formation target substrate 200; and a limiting plate unit 20 arranged between the vapor deposition source 30 and the vapor deposition mask 10, the limiting plate unit 20 including a plurality of first limiting plates (limiting plates 22) which are spaced away from each other as viewed in a direction perpendicular to a principal surface of the vapor deposition mask 10, the vapor deposition source 30 including: a plurality of first openings 31 for injection of vapor deposition particles; and at least one second opening 32 for pressure release, wherein each of the first openings 31 is provided in a corresponding one of gaps (limiting plate openings 23) between the first limiting plates as viewed in the direction perpendicular to the principal surface of the vapor deposition mask 10, and the at least one second opening 32 is provided in such a position as not to face the gaps between the first limiting plates as viewed in the direction perpendicular to the principal surface of the vapor deposition mask 10.

The above configuration allows the second openings 32 to relieve pressure at the film formation and thus makes it possible to prevent an increase in pressure at and near the first openings 31, especially a sharp increase in pressure at and near the first openings 31 at a high vapor deposition rate, by using a simple technique without having to establish a complicated system. Thus, the above configuration makes it possible to prevent a pseudo-spread of the first openings 31 by using a simple technique while achieving the high vapor deposition rate. Consequently, the above configuration makes it possible to, by using a simple technique, prevent an increase in pressure at and near the first openings 31 and prevent the occurrence of abnormal film formation.

In a second aspect of the present invention, a vapor deposition unit 1 can be arranged such that, in the first aspect of the present invention, the at least one second opening 32 is provided so as to face a corresponding one of the first limiting plates (limiting plates 22).

The above configuration enables the first limiting plates to prevent the vapor deposition particles 301 having been injected through the at least one second opening 32 from passing through the gaps between the first limiting plates and then being deposited onto the film formation target substrate 200. In this configuration, the limiting plate unit 20 has the following two functions: (1) a function of controlling isotropic vapor deposition flows having been injected through the first openings 31 so that directivity of these vapor deposition flows is increased; and (2) a function of blocking isotropic vapor deposition flows having been injected through the at least one second opening 32 from reaching the film formation target substrate 200.

In a third aspect of the present invention, a vapor deposition unit 1 can be arranged such that, in the second aspect of the present invention, the at least one second opening 32 is provided in a midsection between the gaps (limiting plate openings 23) which are adjacent to each other and left between the first limiting plates (in other words, in a center of a corresponding one of the first limiting plates in a direction in which the first limiting plates are arranged), as viewed in the direction perpendicular to the principal surface of the vapor deposition mask 10.

The above configuration enables the first limiting plates to more reliably prevent the vapor deposition particles 301 having been injected through the at least one second opening 32 from passing through the gaps between the first limiting plates and then being deposited onto the film formation target substrate 200.

In a fourth aspect of the present invention, a vapor deposition unit 1 can be arranged such that, in the second or third aspect of the present invention, the limiting plate unit 20 has a plurality of second limiting plates (limiting plates 52) which are provided between the vapor deposition source 30 and the first limiting plates (limiting plates 22) so as to face the first limiting plates while being spaced away from each other in the direction in which the first limiting plates are arranged, wherein at least two each of the second limiting plates are provided for each of the first limiting plates, and the at least two each of the second limiting plates facing a corresponding one of the first limiting plates are provided on opposite sides of the at least one second opening 32 facing the corresponding one of the first limiting plates, as viewed in the direction perpendicular to the principal surface of the vapor deposition mask 10.

The above configuration enables the second limiting plates to limit the angle at which vapor deposition particles 301 injected through the at least one second opening 32 enter each gap between the first limiting plates. The above configuration thus enables the second limiting plates to block vapor deposition flows from passing through each gap between the first limiting plates.

In a fifth aspect of the present invention, a vapor deposition unit 1 can be arranged such that, in any one of the second to fourth aspects of the present invention, a plurality of third limiting plates (limiting plates 62) are provided between the first limiting plates (limiting plates 22) and the vapor deposition mask 10 so as to face the first limiting plates while being spaced away from each other in the direction in which the first limiting plates are arranged, and at least one each of the third limiting plates is provided for each of the first limiting plates.

The above configuration enables the third limiting plates to block vapor deposition flows having been injected through the at least one second opening 32 and passed through the gap between the first limiting plates.

In a sixth aspect of the present invention, a vapor deposition unit 1 can be arranged such that, in the fifth aspect of the present invention, each of the third limiting plates (limiting plates 62) is provided in a midsection between the gaps (limiting plate openings 23) which are adjacent to each other and left between the first limiting plates (in other words, in the center of the corresponding one of the first limiting plates in the direction in which the first limiting plates are arranged), as viewed in the direction perpendicular to the principal surface of the vapor deposition mask 10.

The above configuration enables third limiting plates few in number to effectively block vapor deposition flows having been injected through the at least one second opening 32 and passed through the gap between the first limiting plates.

In a seventh aspect of the present invention, a vapor deposition unit 1 can be arranged such that, in any one of the first to sixth aspects of the present invention, the at least one second opening 32 has an opening diameter smaller than that of the first openings 31.

The at least one second opening having a large opening diameter increases the volume of vapor deposition flows injected through the at least one second opening to a degree that cannot be ignored, and thus seriously impair material utilization efficiency. The above configuration achieves a decrease in volume of vapor deposition flows injected through the at least one second opening 32 at the pressure release and thus enables the impairment of the material utilization efficiency to be prevented.

In an eighth aspect of the present invention, a vapor deposition unit 1 can be arranged such that, in the seventh aspect of the present invention, the opening diameter of the at least one second opening 32 in a cross section passing through a center of the at least one second opening 32 is not less than 100 μm.

The at least one second opening 32 having a small opening diameter may cause clogging of the at least one second opening 32. The above configuration enables the possibility of clogging of the at least one second opening 32 to be decreased.

In a ninth aspect of the present invention, a vapor deposition unit 1 is desirably arranged such that, in any one of the first to eighth aspects of the present invention, the limiting plate unit 20 and the at least one second opening 32 are designed such that the limiting plate unit 20 blocks the vapor deposition particles 301 injected through the at least one second opening 32 from reaching the vapor deposition mask 10.

The above configuration enables the vapor deposition particles 301 injected through the at least one second opening 32 to be prevented from passing through a mask opening 11 of the vapor deposition mask 10 and then being deposited onto a film formation target surface 201 of the film formation target substrate 200.

In a tenth aspect of the present invention, a vapor deposition device 100 includes: a vapor deposition unit 1 according to any one of the first to ninth aspects; and a moving device (at least one of a substrate moving device 103 and a vapor deposition unit moving device 104) for, in a state where the vapor deposition mask 10 of the vapor deposition unit 1 faces the film formation target substrate 200, moving at least one of the vapor deposition unit 1 and the film formation target substrate 200 relative to the other thereof in a scanning direction which is perpendicular to the direction in which the first limiting plates (limiting plates 22) are arranged, as viewed in the direction perpendicular to the principal surface of the vapor deposition mask 10, the vapor deposition mask 10 having a width in the scanning direction which width is smaller than a width of the film formation target substrate 200 in the scanning direction, the vapor deposition device 100, while scanning the film formation target substrate 200 in the scanning direction, causing the vapor deposition particles 301 injected through the first openings 31 to be vapor-deposited onto the film formation target substrate 200 through the limiting plate unit 20 and the vapor deposition mask 10.

The above configuration produces effects similar to those produced in the first aspect.

In an eleventh aspect of the present invention, a vapor deposition method is a vapor deposition method for forming, on a film formation target substrate 200, a vapor-deposited film 302 having a predetermined pattern by using a vapor deposition device 100 according to the tenth aspect of the present invention, and includes: a placement step of placing the vapor deposition mask 10 of the vapor deposition unit 1 and the film formation target substrate 200 so as to face each other while being spaced away from each other by a certain distance; a deposition step of, while moving at least one of the vapor deposition unit 1 and the film formation target substrate 200 relative to the other in a direction perpendicular to the direction in which the first limiting plates (limiting plates 22) are arranged as viewed in the direction perpendicular to the principal surface of the vapor deposition mask 10, causing the vapor deposition particles 301 injected through the first openings 31 to be deposited onto the film formation target substrate 200 through the limiting plate unit 20 and the vapor deposition mask 10, the deposition step injecting the vapor deposition particles 301 through the first openings 31 toward the film formation target substrate 200 while pressure in the vapor deposition source 30 is relieved by the at least one second opening 32.

The above method produces effects similar to those produced in the first aspect.

The present invention is not limited to the embodiments, but can be altered by a skilled person in the art within the scope of the claims. The present invention also encompasses, in its technical scope, any embodiment derived by combining technical means disclosed in differing embodiments. Further, it is possible to form a new technical feature by combining the technical means disclosed in the respective embodiments.

INDUSTRIAL APPLICABILITY

The present invention is suitably applicable to (i) a vapor deposition unit for use in scan vapor deposition based on a scanning method which scan vapor deposition allows vapor deposition to be carried out while a film formation target substrate and a vapor deposition unit are moved relative to each other for scanning, and to (ii) a vapor deposition device and a vapor deposition method each of which uses the vapor deposition unit to form a film having a predetermined pattern. The vapor deposition unit, vapor deposition device, and vapor deposition method of the present invention are, in particular, suitably applicable to, for example, a device and method for producing an organic EL display device which device and method are each used in a film forming process of, for example, selectively forming organic layers for an organic EL display device or the like.

REFERENCE SIGNS LIST

1 Vapor deposition unit
10 Vapor deposition mask

11 Mask opening
12 Non-opening section
13 Mask opening group region
20 Limiting plate unit
21 Limiting plate row
22 Limiting plate (first limiting plate)
23 Limiting plate opening (gap between the first limiting plates)
24 Holding body
24a First holding member
24b Second holding member
30 Vapor deposition source
31 First opening
32 Second opening
40 Holder
41, 42, 43 Tray
51 Limiting plate row
52 Limiting plate (second limiting plate)
53 Limiting plate opening
61 Limiting plate row
62 Limiting plate (third limiting plate)
63 Limiting plate opening
100 Vapor deposition device
101 Vacuum chamber
102 Substrate holder
103 Substrate moving device (moving device)
104 Vapor deposition unit moving device (moving device)
200 Film formation target substrate
201 Film formation target surface
202 Film formation pattern area
203 Non-film formation target area
204 Region
205 Film formation target region
301 Vapor deposition particles
302 Vapor-deposited film (normally patterned film)
303 Abnormally patterned vapor-deposited film (abnormally patterned film)

What is claimed is:

1. A vapor deposition apparatus for forming, on a film formation target substrate, a vapor-deposited film having a predetermined pattern,
the vapor deposition apparatus comprising:
a vapor deposition source;
a vapor deposition mask placed between the vapor deposition source and the film formation target substrate; and
a limiting plate arranged between the vapor deposition source and the vapor deposition mask,
the limiting plate including a plurality of first limiting plates which are spaced away from each other as viewed in a direction perpendicular to a principal surface of the vapor deposition mask,
the vapor deposition source including: a plurality of first openings for injection of vapor deposition particles; and at least one second opening for pressure release by injecting the vapor deposition particles, wherein each of the first openings is provided in alignment with one of a plurality of gaps between the first limiting plates as viewed in the direction perpendicular to the principal surface of the vapor deposition mask, and the at least one second opening is provided in such a position to not be in alignment with the gaps between the first limiting plates as viewed in the direction perpendicular to the principal surface of the vapor deposition mask,
wherein the at least one second opening is provided in alignment with one of the plurality of the first limiting plates.

2. The vapor deposition apparatus according to claim 1, wherein the at least one second opening is provided in a midsection between the gaps which are adjacent to each other and are between the first limiting plates, as viewed in the direction perpendicular to the principal surface of the vapor deposition mask.

3. The vapor deposition apparatus according to claim 1, wherein the limiting plate has a plurality of second limiting plates which are provided between the vapor deposition source and the first limiting plates and in alignment with the first limiting plates while being spaced away from each other in the direction in which the first limiting plates are arranged,
wherein at least two each of the second limiting plates are provided for each of the first limiting plates, and the at least two each of the second limiting plates in alignment with one of the plurality of the first limiting plates are provided on opposite sides of the at least one second opening in alignment with the one of the plurality of the first limiting plates, as viewed in the direction perpendicular to the principal surface of the vapor deposition mask.

4. The vapor deposition apparatus according to claim 1, wherein the limiting plate has a plurality of third limiting plates which are provided between the first limiting plates and the vapor deposition mask and in alignment with the first limiting plates while being spaced away from each other in the direction in which the first limiting plates are arranged, and
at least one each of the third limiting plates is provided for each of the first limiting plates.

5. The vapor deposition apparatus according to claim 4, wherein each of the third limiting plates is provided in a midsection between the gaps which are adjacent to each other and left between the first limiting plates, as viewed in the direction perpendicular to the principal surface of the vapor deposition mask.

6. The vapor deposition apparatus according to claim 1, wherein the at least one second opening has an opening diameter smaller than that of the first openings.

7. The vapor deposition apparatus according to claim 6, wherein the opening diameter of the at least one second opening in a cross section passing through a center of the at least one second opening is not less than 100 μm.

8. The vapor deposition apparatus according to claim 1, wherein the limiting plate and the at least one second opening are designed such that the limiting plate blocks the vapor deposition particles injected through the at least one second opening from reaching the vapor deposition mask.

9. A vapor deposition device comprising: a vapor deposition apparatus according to claim 1; and
a moving device for, in a state where the vapor deposition mask of the vapor deposition apparatus faces the film formation target substrate, moving at least one of the vapor deposition apparatus and the film formation target substrate relative to the other thereof in a scanning direction which is perpendicular to the direction in which the first limiting plates are arranged, as viewed in the direction perpendicular to the principal surface of the vapor deposition mask,
the vapor deposition mask having a width in the scanning direction which width is smaller than a width of the film formation target substrate in the scanning direction, the vapor deposition device, while scanning the film formation target substrate in the scanning direction,
causing the vapor deposition particles injected through the first openings to be vapor-deposited onto the film formation target substrate through the limiting plate and the vapor deposition mask.

10. A vapor deposition method for forming, on a film formation target substrate, a vapor-deposited film having a predetermined pattern by using a vapor deposition device according to claim 9, the method comprising:
  a placement step of placing the vapor deposition mask of the vapor deposition apparatus and the film formation target substrate so as to face each other while being spaced away from each other by a certain distance; and
  a deposition step of, while moving at least one of the vapor deposition apparatus and the film formation target substrate relative to the other in a direction perpendicular to the direction in which the first limiting plates are arranged as viewed in the direction perpendicular to the principal surface of the vapor deposition mask, causing the vapor deposition particles injected through the first openings to be deposited onto the film formation target substrate through the limiting plate and the vapor deposition mask,
  the deposition step injecting the vapor deposition particles through the first openings toward the film formation target substrate while pressure in the vapor deposition source is relieved by the at least one second opening.

* * * * *